(12) United States Patent
Tsukahara et al.

(10) Patent No.: US 6,181,181 B1
(45) Date of Patent: Jan. 30, 2001

(54) PHASE SHIFTER FOR A QUADRATURE MODULATOR AND AN IMAGE SUPPRESSION MIXER

(75) Inventors: Masahiro Tsukahara; Koju Aoki, both of Kasugai (JP)

(73) Assignee: Fujitsu Limited, Kawasaki (JP)

( * ) Notice: Under 35 U.S.C. 154(b), the term of this patent shall be extended for 0 days.

(21) Appl. No.: 09/260,483

(22) Filed: Mar. 2, 1999

(30) Foreign Application Priority Data

Jun. 26, 1998 (JP) .................................................. 10-180345
Jul. 3, 1998 (JP) .................................................. 10-189253

(51) Int. Cl.⁷ ...................................................... H03K 3/00
(52) U.S. Cl. ............................................ 327/233; 327/113
(58) Field of Search ...................................... 327/113, 116, 327/119, 355, 356, 357, 231, 233, 234, 236, 235, 237, 238, 243, 244, 252, 254, 255; 455/323, 333

(56) References Cited

U.S. PATENT DOCUMENTS

| | | |
|---|---|---|
| 4,843,352 * | 6/1989 | Kamisaka et al. ...................... 332/22 |
| 4,908,532 * | 3/1990 | Chadwick ............................. 307/512 |
| 5,644,260 * | 7/1997 | DaSilva et al. ....................... 327/238 |
| 5,963,073 * | 10/1999 | Fujita et al. .......................... 327/254 |

FOREIGN PATENT DOCUMENTS 8-125447   5/1996   (JP) .
9-98067    4/1997   (JP) .

* cited by examiner

*Primary Examiner*—Toan Tran
*Assistant Examiner*—Linh Nguyen
(74) *Attorney, Agent, or Firm*—Armstrong, Westerman, Hattori, McLeland & Naughton

(57) ABSTRACT

A phase shifter that may be used in a quadrature modulator or an image suppression mixer. The phase shifter includes a low pass filter that receives an input signal and generates a first carrier signal. A high pass filter also receives the input signal and generates a second carrier signal. A phase difference detection circuit connected to the high and low pass filters receives the first and second carrier signals and generates a control signal based on the phase difference between the carrier signals. The control signal is fed back to at least one of the low pass filter and the high pass filter to compensate for phase errors caused by parasitic capacitance. The phase shifter has a small circuit area and is very accurate, allowing it to be used in communications devices.

16 Claims, 22 Drawing Sheets

PHASE SHIFTER FOR A QUADRATURE MODULATOR AND AN IMAGE SUPPRESSION MIXER

BACKGROUND OF THE INVENTION

The present invention generally relates to a phase shifter, and, more particularly, to a quadrature modulator and an image suppression mixer each of which includes the phase shifter.

FIG. 1 is a circuit diagram of a conventional phase shifter 11. The phase shifter 11 comprises a low pass filter (LPF) 12 and a high pass filter (HPF) 13. The LPF 12 is an integrating circuit including a resistor R1 and a capacitor C1. The HPF 13 is a differential circuit including the capacitor C2 and the resistor R2.

FIG. 2 is a graph showing the relationship between the frequency and phase in the LPF 12 and the HPF 13. The LPF 12 receives an input signal LOin and generates a first carrier signal LO1 having a phase of −45 degrees at a cutoff frequency fc. The HPF 13 receives the input signal LOin and generates a second carrier signal LO2 having a phase of +45 degrees at the cutoff frequency fc. Accordingly, the phase difference between the output signals LO1 and LO2 is substantially 90 degrees.

However, the phase shifter 11 of FIG. 1 is a theoretical circuit, a real circuit therefor being shown in FIG. 3. The capacitors C1, C2 each has a parasitic resistor Rs. Therefore, the LPF 12 generates a first carrier signal LO3 having a phase of (−45−Δ) degrees, and the HPF 13 generates a second carrier LO4 having a phase of (+45+Δ) degrees. Accordingly, the phase difference between the two signals is not exactly 90 degrees. As a result, a circuit for compensating for the phase errors generated by the parasitic resistors Rs is required. This increases the circuit area of the phase shifter 11.

Another conventional digital phase shifter comprises a frequency divider consisting of a flip-flop. The frequency divider divides the frequency of an input signal in half. The phase shifter generates two output signals in which the phase difference between the signals is substantially 90 degrees using a frequency division signal. However, to divide the frequency of the input signal in half, a frequency multiplier for supplying the input signal in which the frequency is multiplied by two to the frequency divider is required. The provision of the frequency multiplier increases the circuit area of the phase shifter.

A quadrature modulator used in digital mobile communications includes a phase shifter. It is preferable for the quadrature modulator to have a small circuit area and perform modulation with high accuracy. Therefore, a phase shifter having high phase accuracy and small circuit area is necessary.

FIG. 4 is a block diagram of a conventional image suppression mixer circuit (hereinafter referred to as mixer circuit) 211. The mixer circuit removes an image component contained in the output signal. The mixer circuit 211 includes first and second phase shifters 212 and 213 and an image suppression circuit 214. The image suppression circuit 214 includes first and second mixers 215 and 216 and a adder 217.

The first phase shifter 212 receives an intermediate frequency signal IFin and generates first and second intermediate frequency signals IF0 and IF90 in which the phase difference between the signals is substantially 90 degrees. The phase difference of the second intermediate frequency signal IF90 for a first intermediate frequency signal LO0 is 90 degrees. The second phase shifter 213 receives a local signal LOin having a local oscillation frequency and generates first and second local signals LO0 and LO-90 in which the phase difference between the signals is substantially 90 degrees. The phase difference of the second local signal LO-90 from the first local signal LO0 is −90 degrees.

The first mixer 215 multiplies the first intermediate frequency signal IF0 by the first local signal LO0 and generates a first modulation signal V1. The first modulation signal V1 is obtained in accordance with the following equation (1).

$$V1 = \cos(2\pi f_{LO}t) \times \cos(2\pi f_{IF}t)$$
$$= \frac{1}{2}[\cos\{2\pi(f_{LO}+f_{IF})t\} + \cos\{2\pi(f_{LO}-f_{IF})t\}]$$

The second mixer 216 multiplies the second intermediate frequency signal IF90 by the second local signal LO-90 and generates a second modulation signal V2. The second modulation signal V2 is obtained in accordance with the following equation (2).

$$V2 = \cos(2\pi f_{LO}t + 90°) \times \cos(2\pi f_{IF}t - 90°)$$
$$= \frac{1}{2}[\cos\{2\pi(f_{LO}+f_{IF})t\} - \cos\{2\pi(f_{LO}-f_{IF})t\}]$$

The adder 217 receives the first and second modulation signals V1 and V2 from the first and second mixers 215 and 216 and generates an output signal RFout by combining the first and second modulation signals V1 and V2. The output signal RFout is obtained in accordance with the following equation (3).

$$RFout = V1 + V2$$
$$= \cos\{2\pi(f_{LO}+f_{IF})t\}$$

The output signal RFout includes only the (fLO+fIF) component. In Equations (1) and (2), the (fLO−fIF) component is an image frequency signal component. Thus, the mixer circuit 11 suppresses or rejects the image frequency component.

The mixer circuit 211 can also be used as a downconverter that reduces the frequency of an input signal. In this case, the first phase shifter 212 receives a high frequency input signal RFin that is a receiving signal for communication devices. The mixer circuit 211 combines the input signal RFin and the local signal LOin having the local oscillation frequency and generates an output signal IFout having an intermediate frequency that is lower than that of the input signal RFin. The output signal IFout is obtained in accordance with the following equation (4).

$$IFout = V1+V2 = \cos\{2\pi(f_{LO}+f_{IF})t\}$$

The mixer circuit 211 implements highly accurate image suppression by accurately maintaining the phase difference among the output signals IF0, IF90, LO0, and LO-90 of the first and second phase shifters 212 and 213 at 90 degrees. However, if the phase shifters 212 and 213 are not manufactured evenly, the phase difference of the output signal is not accurately maintained at 90 degrees. This makes it difficult to fully suppress the image frequency component.

To solve the aforementioned problems, Japanese Unexamined Patent Publication No. 8-125447 discloses an improved image suppression mixer circuit. The image suppression mixer circuit comprises two unit mixers that output direct current (DC) signals and a comparator that receives the DC signals output from the two unit mixers via a variable phase shifter and a phase shifter and calculates the phase difference of the first and second IF signals based on the level difference of the DC signals. The image suppression mixer circuit further includes a driver that controls the variable shifter so that a phase error is zero. Thus, a relative phase error is corrected and an image frequency component is suppressed. However, because the variable phase shifter is connected to the input of a adder, the mixer circuit is used only for the application of down-conversion. Further, the mixer circuit includes a coupler. Neither the mixer nor the coupler is integrated on a semiconductor substrate. This impedes miniaturization of the mixer circuit.

It is an object of the present invention to provide a phase shifter that obtains the two output signals in which the phase difference between the signals is substantially 90 degrees and has a small circuit area.

It is the second object of the present invention to provide an image suppression mixer that reduces differences due to uneven manufacturing.

SUMMARY OF THE INVENTION

Briefly stated, the present invention provides a phase shifter. The phase shifter includes a low pass filter for receiving an input signal and generating a first carrier signal and a high pass filter for receiving the input signal and generating a second carrier signal. A phase difference detection circuit is connected to the low pass filter and the high pass filter and generates a control signal based on a phase difference between the first and second carrier signals. At least one of the low pass filter and the high pass filter includes a variable element that changes its own characteristics in accordance with the control signal.

The present invention further provides a quadrature modulator including a phase shifter for receiving an input signal and generating first and second carrier signals. The phase shifter includes a low pass filter for receiving the input signal and generating the first carrier signal and a high pass filter for receiving the input signal and generating the second carrier signal. A phase difference detection circuit is connected to the low pass filter and the high pass filter and generates a control signal based on a phase difference between the first and second carrier signals. At least one of the low pass filter and the high pass filter includes a variable element for changing its own characteristics in accordance with the control signal. A quadrature modulation circuit is connected to the phase shifter and receives the first and second carrier signals and first and second base band signals and generating a modulation signal.

The present invention provides an image suppression mixer including first to fourth phase shifters. The first phase shifter receives a first input signal and generates first and second signals having a phase difference of a predetermined degree. The second phase shifter receives a second input signal and generates third and fourth signals having a phase difference between of a predetermined degree. The third phase shifter is connected to the first phase shifter and receives the second signal from the first shifter to shift the phase of the second signal in accordance with a first control signal. The fourth phase shifter is connected to the second phase shifter and receives the fourth signal from the second phase shifter to shift the phase of the fourth signal in accordance with a second control signal. A first phase difference detection circuit is connected to the first and third phase shifters and detects the phase difference between the first and second signals to generate a first detection signal indicating the phase difference. A second phase difference detection circuit is connected to the second and third phase shifters and detects the phase difference between the third and fourth signals to generate a second detection signal indicating the phase difference. A differential circuit is connected to the third and fourth phase shifters and the first and second phase difference detection circuits and receives the first and second detection signals and generating the first and second control signals. The first control signal originates from the difference between the first and second detection signals, and the second control signal is an inverse of the first control signal. An image suppression circuit is connected to the first to fourth phase shifters, receives the first to fourth signals, generates a first mixing signal by mixing the first and third signals, generates a second mixing signal by mixing the second and fourth signals, and generates a modulation output signal by combining the first and second mixing signals.

The present invention further provides an image suppression mixer including a first phase shifter for receiving a first input signal and generating first and second signals having a phase difference of a predetermined degree and a second phase shifter for receiving a second input signal and generating third and fourth signals having a phase difference of a predetermined degree. A first phase difference detection circuit is connected to the first phase shifter and detects the phase difference between the first and second signals to generate a first detection signal indicating the phase difference. A second phase difference detection circuit is connected to the second phase shifter and detects the phase difference between the third and fourth signals to generate a second detection signal indicating the phase difference. A third phase shifter is connected between the first and second phase difference detection circuits and one of the first and second phase shifters and receives one of the second signal and the fourth signal from the connected one of the first phase shifter and the second phase shifter to shift the phase of the received signal in accordance with a control signal. A differential circuit is connected to the third phase shifter and the first and second phase difference detection circuits and receives the first and second detection signals to generate the control signal originating from the difference between the first and second detection signals. An image suppression circuit is connected to the first to third phase shifters, receives the first to fourth signals, generates a first mixing signal by mixing the first and third signals, generates a second mixing signal by mixing the second and fourth signals, and generates a modulation output signal by combining the first and second mixing signals.

The present invention provides an image suppression mixer including a first phase shifter for receiving a first input signal and generating first and second signals having a phase difference of a predetermined degree. The first phase shifter shifts the phase of the second signal in accordance with a first control signal. The image suppression mixer further includes a second phase shifter for receiving a second input signal and generating third and fourth signals having a phase difference of a predetermined degree. The second phase shifter shifts the phase of the fourth signal in accordance with a second control signal. A first phase difference detection circuit is connected to the first phase shifter and detects the phase difference between the first and second signals to generate a first detection signal indicating the phase difference. A second phase difference detection circuit is connected to the second phase shifter and detects the phase difference between the third and fourth signals to generate a second detection signal indicating the phase difference. A differential circuit is connected to the first and second phase shifters and the first and phase difference detection circuits and receives the first and second detection signals and generating the first and second control signals. Each of the control signals originating from the difference between the first and second detection signals. The second control signal is an inverse of the first control signal. An image suppression circuit is connected to the first and second phase shifters, receives the first to fourth signals, generates a first mixing signal by mixing the first and third signals, generates a second mixing signal by mixing the second and fourth signals, and generates a modulation output signal by combining the first and second mixing signals.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
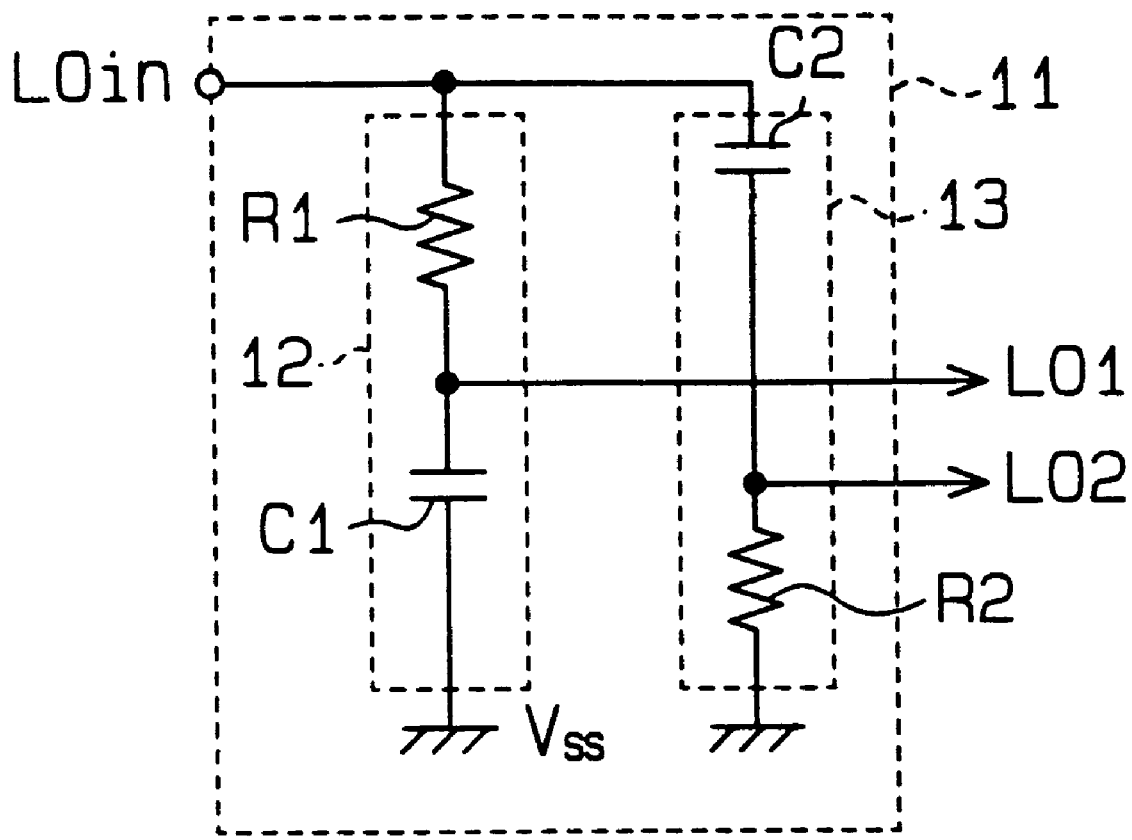
FIG. 1 is a circuit diagram of a conventional phase shifter.
Figure 2:
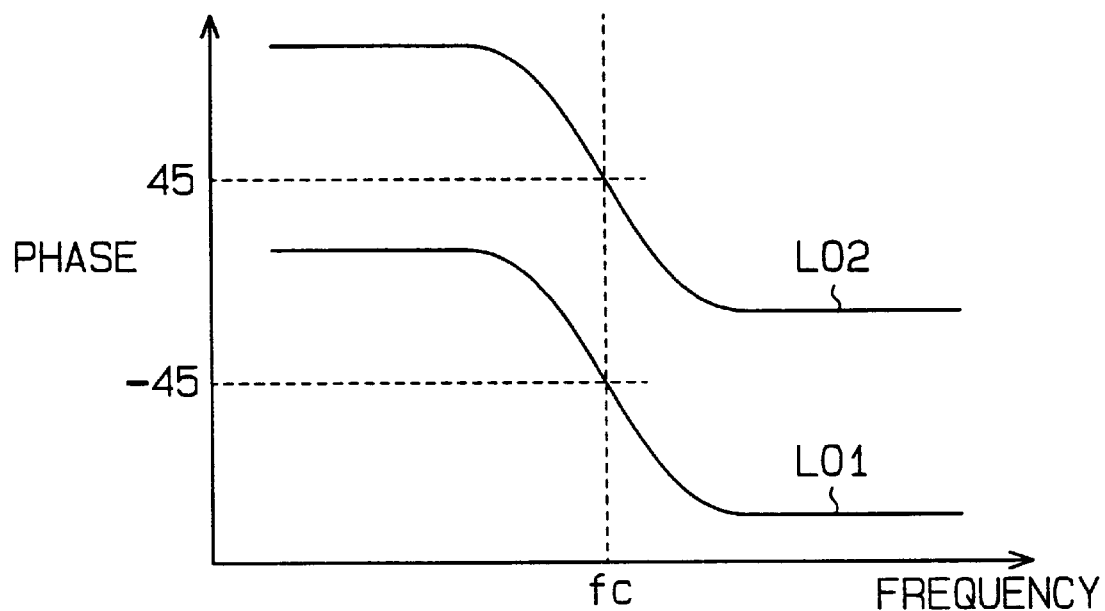
FIG. 2 is a graph showing the relationship between the frequency and phase of the phase shifter of FIG. 1.
Figure 3:
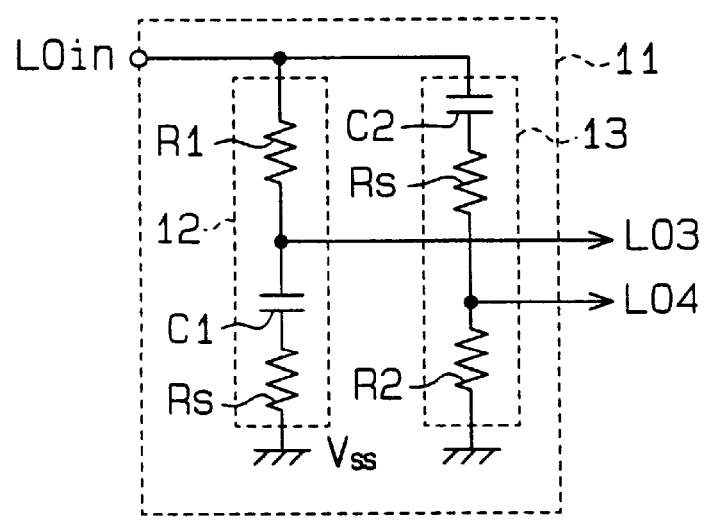
FIG. 3 is an equivalent circuit diagram of a conventional phase shifter.

In the drawings, like numerals are used for like elements throughout.

(First Embodiment)

Figure 5:
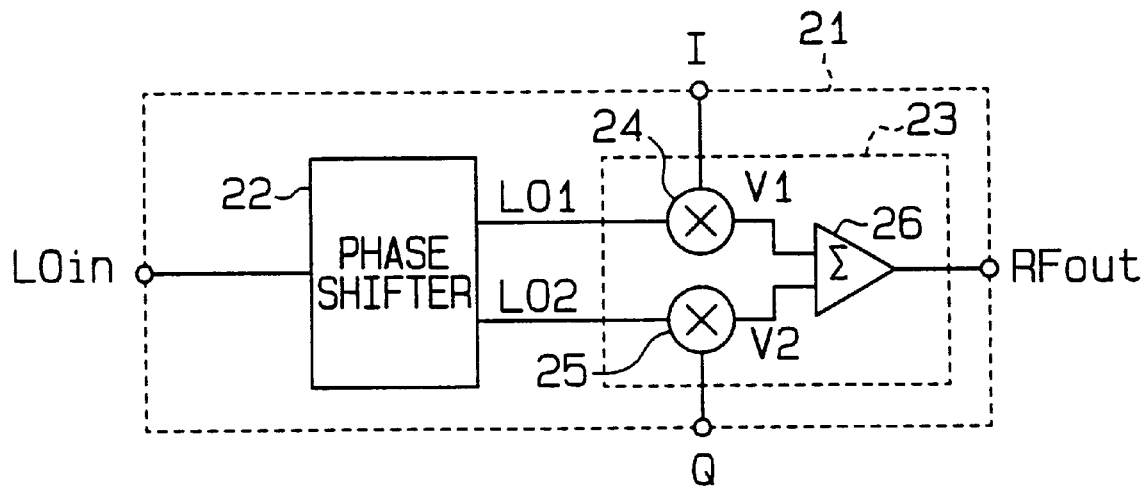
FIG. 5 is a schematic block diagram of a quadrature modulator including a phase shifter according to a first embodiment of the present invention.

FIG. 5 is a schematic block diagram of a quadrature modulator 21 used in a digital mobile communication device. The quadrature modulator 21 includes a phase shifter 22 and a quadrature modulation unit 23, all of which is preferably formed on a single semiconductor substrate. The quadrature modulation unit 23 includes first and second modulation mixers 24 and 25 and an adder 26.

The phase shifter 22 receives a carrier signal LOin and generates first and second carrier signals LO1 and LO2 in which the phase difference between the signals is substantially 90 degrees. The first modulation mixer 24 receives a first base band signal I and the first carrier signal LO0 from the phase shifter 22 and generates a first modulation signal V1 by mixing the first base band signal I and the first carrier signal LO1. The second modulation mixer 25 receives a second base band signal Q and the second carrier signal LO2 from the phase shifter 22 and generates the second modulation signal V2 by mixing the second base band signal Q and the second carrier signal LO2.

The adder 26 receives the first and second modulation signals V1 and V2 from the modulation mixers 24 and 25 and generates the output signal RFout by adding the first and second modulation signals V1 and V2.

Figure 6:
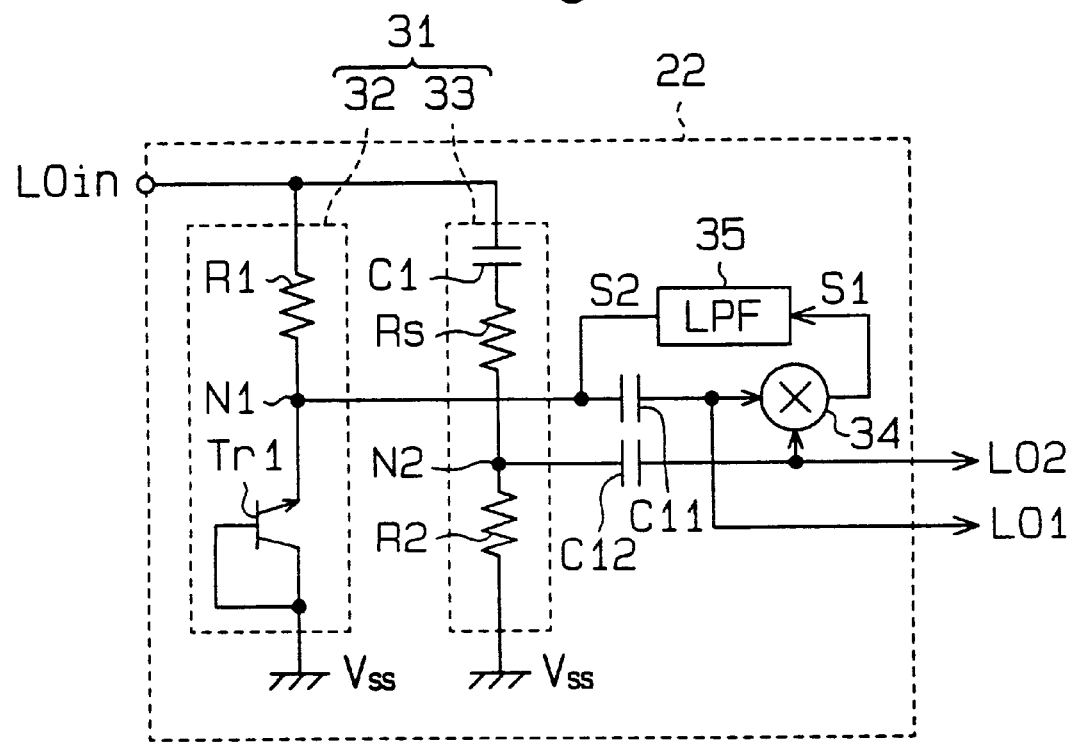
FIG. 6 is a circuit diagram of the phase shifter of FIG. 5.

FIG. 6 is a circuit diagram of the phase shifter 22 according to a first embodiment of the present invention. The phase shifter 22 includes a CR phase shifter 31. The CR phase shifter 31 includes a low pass filter (LPF) 32 and a high pass filter (HPF) 33.

The LPF 32 includes the resistor R1 and an NPN transistor Tr1 as a variable element. The input signal LOin is supplied to the first terminal of the resistor R1 and the second terminal of the resistor R1 is connected to the emitter of the transistor Tr1. The collector of the transistor Tr1 is connected to a low potential power supply VSS and the base of the transistor Tr1 is connected to its own collector. This allows the transistor Tr1 to have a junction capacitance CJ according to the pn junction between the base and emitter. The junction capacitance CJ corresponds to the difference between the voltage of the power supply VSS and the voltage of a node N1 between the resistor R1 and the emitter. The LPF 32 operates as an integrating circuit. The LPF 32 receives the input signal LOin and outputs an output signal from the node N1. The output signal has a phase that corresponds to the resistance of the resistor R1 and the junction capacitance CJ of the transistor Tr1.

The HPF 33 is a differential circuit including a capacitor C1 and a resistor R2. The input signal LOin is supplied to the first terminal of the capacitor C1 and the second terminal of the capacitor C1 is connected to the first terminal of the resistor R2. The second terminal of the resistor R2 is connected to the low potential power supply VSS. The capacitor C1 has a parasitic resistor Rs. The parasitic resistor Rs, shown in FIG. 6, is a resistance generated by providing the capacitor C1, and it is well known to one skilled in the art that no such actual resistor is connected to a practical circuit.

The HPF 33 receives the input signal LOin and outputs an output signal from a node N2 between the capacitor C1 and the resistor R2. The output signal has a phase that corresponds to the resistance of the resistor R2, the resistance of the parasitic resistor Rs, and the capacitance of the capacitor C1.

The node N1 is connected to the first terminal of a capacitor C11, and the second terminal of the capacitor C11 is connected to a phase difference detection circuit 34. The node N2 is connected to the first terminal of a capacitor C12, and the second terminal of the capacitor C12 is connected to the phase difference detection circuit 34.

The capacitors C11 and C12 remove the DC component from the output signal of the LPF 32 and the HPF 33 by means of AC coupling, respectively, which allows the first and second carrier signals LO1 and LO2 having an AC component to be supplied to the phase difference detection signal 34.

The phase difference detection circuit 34 is preferably a frequency mixer (frequency converter). The phase difference detection circuit 34 detects the phase difference of the first and second carrier signals LO1 and LO2 and generates an output signal S1 that corresponds to their detected phase differences. The signal S1 includes a DC component. The output signal S1 (MIXout) is obtained in accordance with the following equation (5).

$$MIXout = \cos(2\pi ft + \phi 1) \times \cos(2\pi ft + \phi 2)$$
$$= \frac{1}{2}[\cos\{2\pi(2f)t + \phi 1 + \phi 2\} + \cos(\phi 1 - \phi 2)]$$

$\phi 1$ is the phase of the first carrier signal LO1 and $\phi 2$ is the phase of the second carrier signal LO2. The second term in the aforementioned equation is the DC component.

A second LPF 35 receives the signal S1 generated by the phase difference detection circuit 34 and provides a control signal S2 that is the DC component of the complementary signal to the node N1. Thus, the control signal S2 originating from the phase difference of the first and second carrier signals LO1 and LO2 is fed back to the transistor Tr1. The feedback of the control signal S2 changes the junction capacitance CJ that corresponds to the voltage difference between the voltage of the node N1 and the voltage of the low potential power supply VSS. Subsequently, the junction capacitance CJ is controlled so that the first and second phase difference signals LO1 and LO2 in which the phase difference between the signals is substantially 90 degrees is generated. Hereupon, because the capacitor C11 allows only the AC component to pass through, the control signal S2 is not supplied to the phase difference detection circuit 34 via the capacitor C11.

Figure 7:
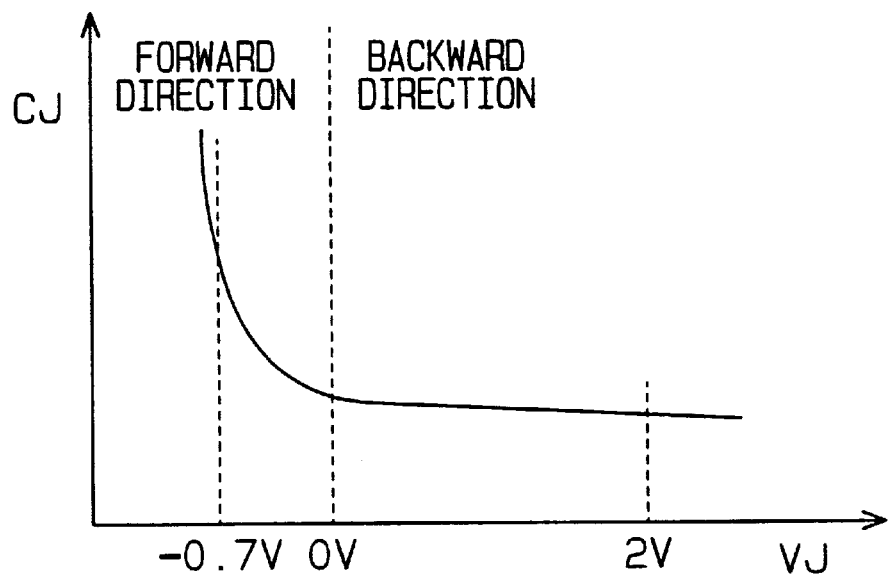
FIG. 7 is a graph showing the relationship between the voltage and junction capacitance of a transistor of the phase shifter of FIG. 5.

For example, if a voltage VJ of the node N1 is two (2) volts and the phase difference of the first and second carrier signals LO0 and LO2 is 92 degrees, the phase difference detection circuit 34 outputs the control signal S2 having a voltage Vs (2−cos($\phi 1-\phi 2$)=2−cos 92=2.035 (volts)). When the voltage Vs is applied to the node N1, the junction capacitance CJ of the transistor Tr1 is reduced (see FIG. 7). This allows the cutoff frequency fc of the LPF 32 to increase and the phase $\phi 1$ of the first carrier signal LO0 to increase. As a result, the phase difference of the first and second carrier signals LO1 and LO2 approaches 90 degrees. In FIG. 7, the forward voltage is negative.

As another example, the case where the voltage VJ of the node N1 is two (2) volts and the phase difference of the first and second carrier signals LO0 and LO2 is 89 degrees is described. In this case, the phase difference is overshot by the feedback. The phase difference detection circuit 34 outputs the control signal S2 having a voltage Vs (2−cos 89 =1.983 volts). When the voltage Vs is applied to the node N1, the junction capacitance CJ of the transistor Tr1 increases. This allows the cutoff frequency fc of the LPF 32 to decrease and the phase $\phi 1$ of the first carrier signal LO1 to decrease. As a result, the phase difference of the first and second signals LO1 and LO2 approaches 90 degrees.

As described above, for the first embodiment, the junction capacitance of the transistor Tr1 is changed by feedback control. This prevents having to increase the circuit area and allows the first and second carrier signals LO1 and LO2 in which the phase difference between the signals is substantially 90 degrees to be accurately obtained. The quadrature modulator 21 performs highly accurate modulation using the phase shifter 22 that generates those first and second carrier signals LO1 and LO2.

Figure 8:
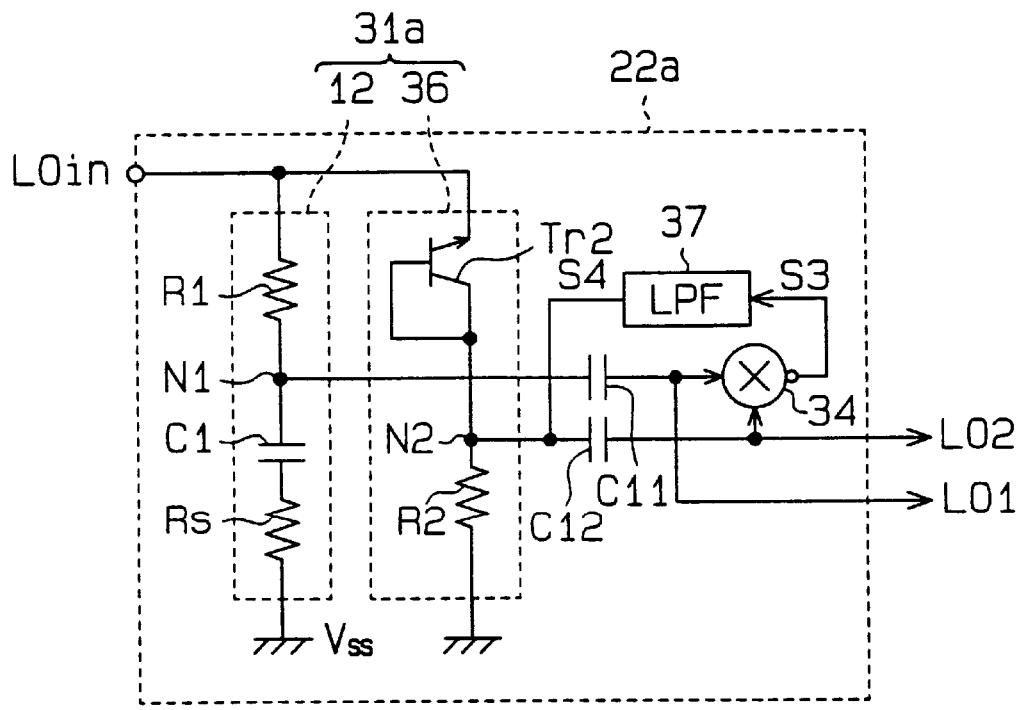
FIG. 8 is a circuit diagram of a first modified phase shifter according to the first embodiment.

FIG. 8 shows a first modification example of the first embodiment. A phase shifter 22a includes a CR phase shifter 31a, the phase difference detection circuit 34, an LPF 37, and the capacitors C11 and C12. The CR phase shifter 31a includes the LPF 12 and an HPF 36. The HPF 36 includes a resistor R2 and an NPN transistor Tr2 as a variable element (variable-capacitance element). The input signal LOin is supplied to the emitter of the transistor Tr2, and the base and collector of the transistor Tr2 are connected to the low potential power supply VSS via the resistor R2. The node N2 between the collector of the transistor Tr2 and the resistor R2 is connected to the second LPF 37. The second LPF 37 receives an inverse signal S3 of the output signal S1 (not shown) generated by the phase difference detection circuit 34 and supplies a control signal S4 to the node N2. The control signal S4 is an inverse signal of the control signal S2 (FIG. 6). The phase shifter 22a cancels the phase shift originating from the parasitic resistor Rs of the capacitor C1 of the LPF 12 by feedback-controlling the junction capacitance of the transistor Tr2.

Figure 9:
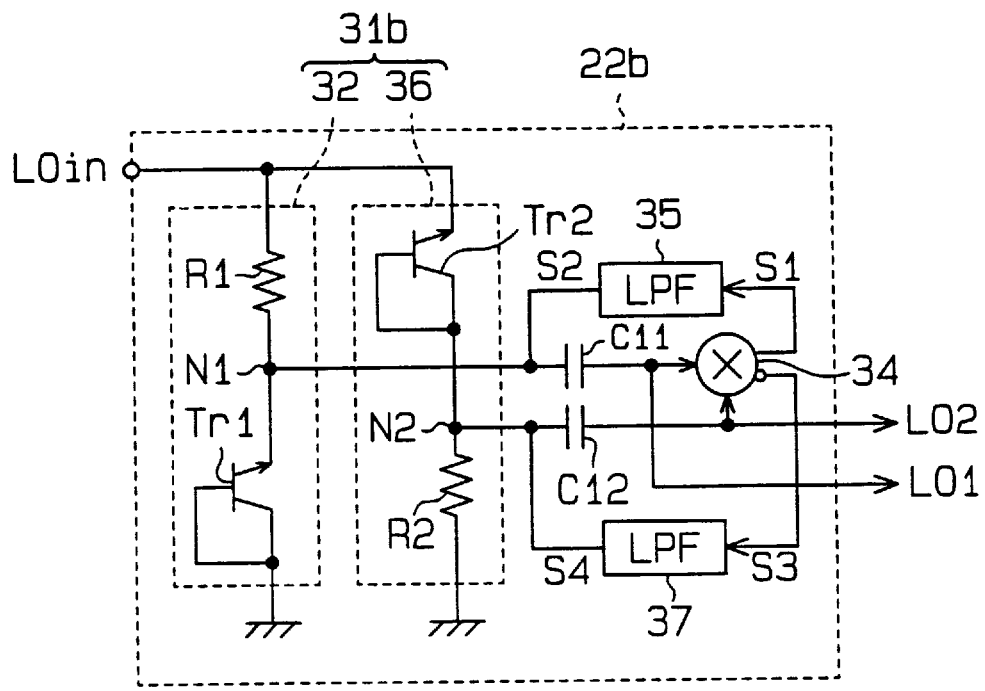
FIG. 9 is a circuit diagram of a second modified phase shifter according to the first embodiment.

FIG. 9 shows a second modification example according to the first embodiment. A phase shifter 22b includes a CR phase shifter 31b, the phase difference detection circuit 34, the LPF 35 and the LPF 37, and the capacitors C11 and C12. The CR phase shifter 31b includes the LPF 32 and the LPF 36. The LPF 32 includes the resistor R1 and the first NPN transistor Tr1, and the HPF 36 includes a second NPN transistor Tr2 and the resistor R2. The control signal S2 is supplied to the node N1 via the second LPF 35. The control signal S4 is supplied to the node N2 via the third LPF 37. The phase shifter 22b outputs the first and second carrier signals LO1 and LO2 having a phase difference of 90 degrees by feedback-controlling the junction capacitance of each of the transistors Tr1 and Tr2.

Figure 10:
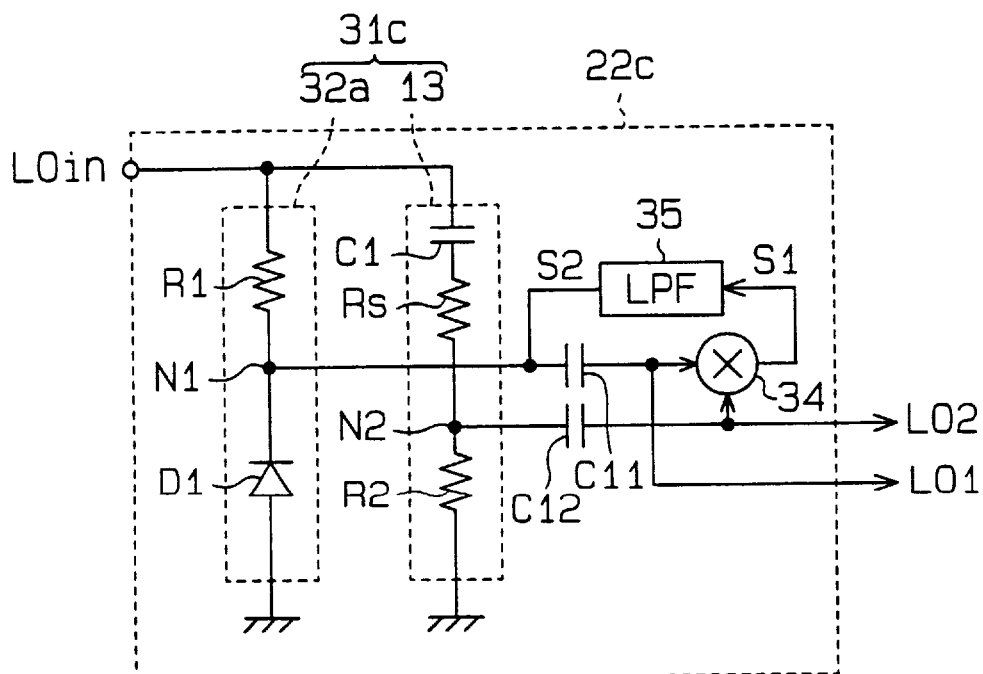
FIG. 10 is a circuit diagram of a third modified phase shifter according to the first embodiment.

FIG. 10 is a circuit diagram of a phase shifter 22c that uses a diode D1 instead of the transistor Tr1. An LPF 32a of the phase shifter 22c includes the resistor R1 and the diode D1 connected in series.

Figure 11:
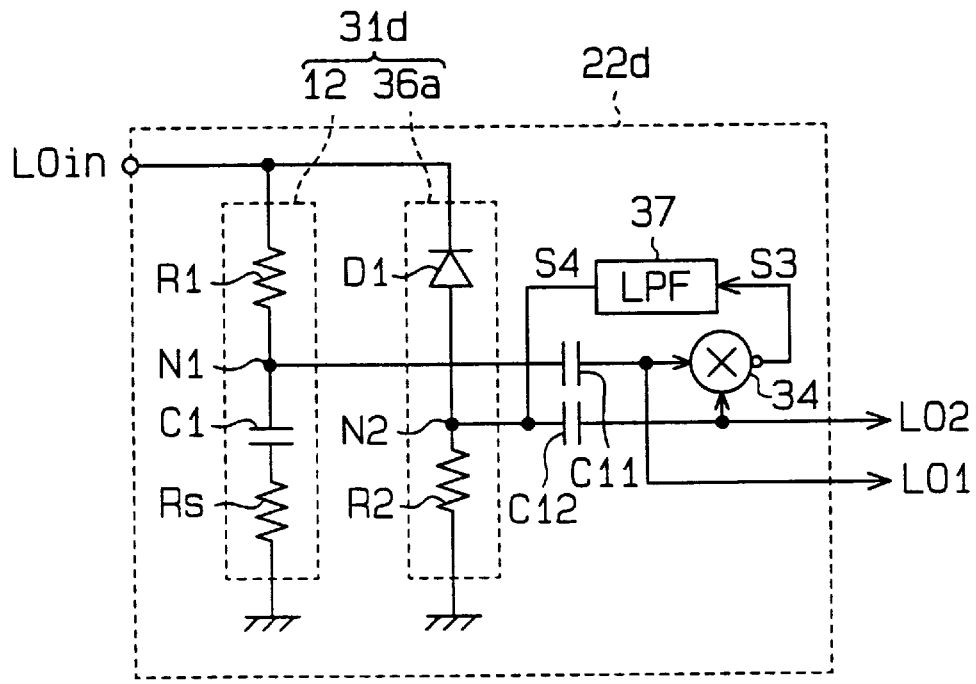
FIG. 11 is a circuit diagram of a fourth modified phase shifter according to the first embodiment.

FIG. 11 is a circuit diagram of a phase shifter 22d that uses the diode D1 instead of the transistor Tr2 in an HPF 36a. The HPF 36a includes the resistor R2 and the diode D1 connected in series. The phase shifters 22c (FIG. 10) and 22d (FIG. 11) generate the first and second carrier signals LO1 and LO2 having a phase difference of 90 degrees by feedback-controlling the junction capacitance of the diode D1.

(Second Embodiment)

Figure 12:
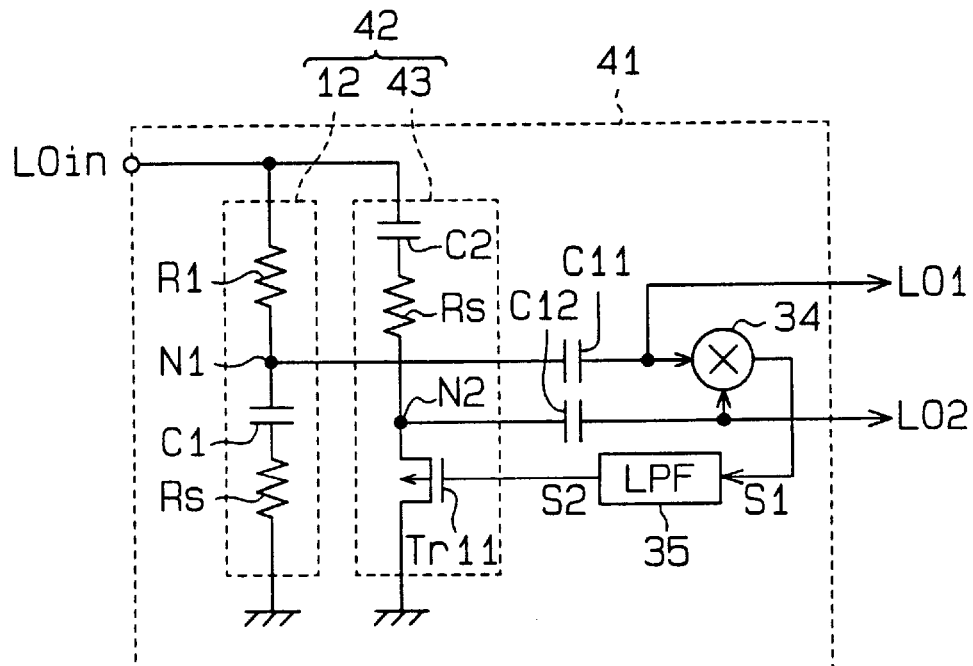
FIG. 12 is a circuit diagram of a phase shifter according to a second embodiment of the present invention.

FIG. 12 is a circuit diagram of a phase shifter 41 according to a second embodiment of the present invention. The phase shifter 41 includes a CR phase shifter 42, the phase difference detection circuit 34, the second LPF 35, and the capacitors C11 and C12. The CR phase shifter 42 includes the LPF 12 and an HPF 43. The HPF 43 includes the capacitor C2 and a P-channel MOS transistor Tr11 as a variable resistor element. An N-channel MOS transistor may be used instead of the P-channel MOS transistor.

The input signal LOin is supplied to the first terminal of the capacitor C2 and the second terminal of the capacitor C2 is connected to the drain of the MOS transistor Tr11. The capacitor C2 includes the parasitic resistance Rs connected in series. The source of the MOS transistor Tr11 is connected to the low potential power supply VSS and the gate is connected to the LPF 35.

The phase difference detection circuit 34 generates the signal S1 having a voltage that corresponds to the phase difference of the first and second carrier signals LO1 and LO2. The LPF 35 receives the signal S1 from the phase difference detection circuit 34 and supplies the control signal S2 to the gate of the MOS transistor Tr11. When the N-channel MOS transistor is used, the inverse signal of the control signal S2 is supplied to the gate of the N-channel MOS transistor.

The MOS transistor Tr11 has an 'on' resistance that corresponds to the voltage of the control signal S2 supplied to the gate. Accordingly, the phase difference of the first and second carrier signals LO1 and LO2 approaches 90 degrees by feedback-controlling the 'on' resistance.

As another alternative example of the second embodiment, the MOS transistor Tr11 may also be used instead of the resistor R1 in the LPF 12.

(Third Embodiment)

Figure 13:
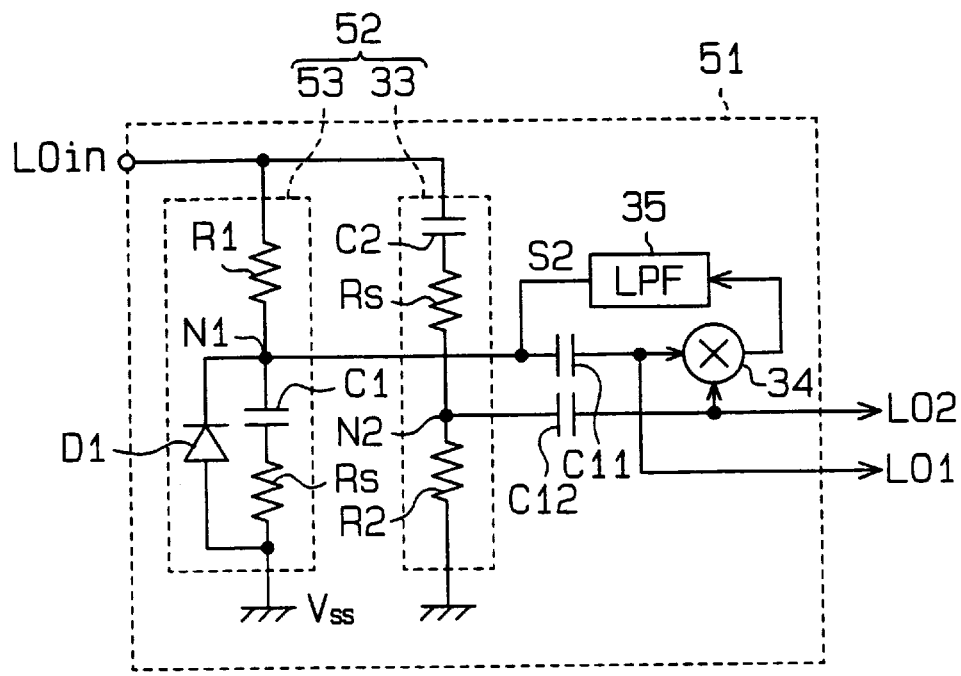
FIG. 13 is a circuit diagram of a phase shifter according to a third embodiment of the present invention.

FIG. 13 is a circuit diagram of a phase shifter 51 according to a third embodiment of the present invention. The phase shifter 51 includes a CR phase shifter 52, the phase difference detection circuit 34, the second LPF 35, and the capacitors C11 and C12. The CR phase shifter 52 includes an LPF 53 and the HPF 33.

The LPF 53 includes the diode D1 as a variable-capacitance element connected in parallel to the capacitor C1 and the parasitic resistor Rs connected in series. Alternatively, the NPN transistor Tr1 may be connected in parallel to the capacitor C1 and the parasitic resistor Rs instead of the diode D1.

The diode D1 has a junction capacitance according to the control signal S2 output from the LPF 35. Accordingly, the cutoff frequency of the LPF 53 is determined depending on the combined capacitance of the capacitor C1 and the diode D1 and the combined resistance of the resistor R1 and the parasitic resistor Rs. Also, the capacitance of the LPF 53 is finely adjusted by feedback control. In other words, the cutoff frequency of the LPF 53 is changed by the control signal S2 according to the phase difference of the first and second carrier signals LO1 and LO2. This allows the first and second carrier signals LO0 and LO2 having a phase difference of 90 degrees to be generated.

As an alternative example of the third embodiment, a diode may be connected in parallel to the capacitor C2 of the HPF 33. In this case, as in FIGS. 8 and 11, the control signal S4 is supplied from the phase difference detection circuit 34 to the node N2 via the third LPF 37. Further, diodes may be connected in parallel to both the capacitor C1 of the LPF 12 and the capacitor C2 of the HPF 33.

Figure 14:
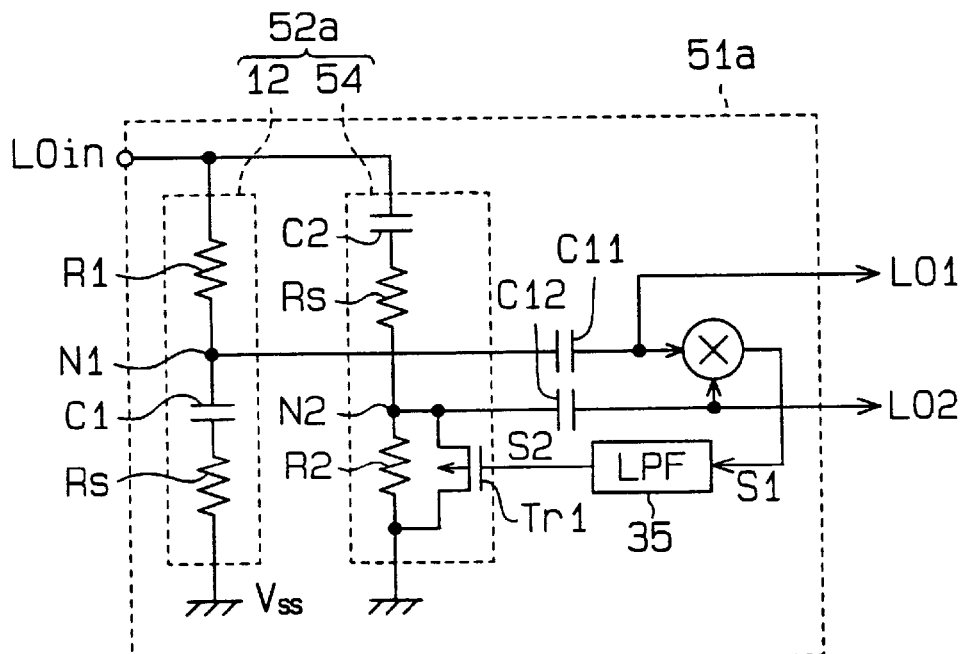
FIG. 14 is a circuit diagram of a modified phase shifter according to the third embodiment.

FIG. 14 shows a modification example of the third embodiment. An HPF 54 of a phase shifter 51a includes the MOS transistor Tr11 connected in parallel to the resistor R2. The control signal S2 is supplied to the gate of the MOS transistor Tr11. The 'on' resistance of the MOS transistor Tr11 is controlled using the control signal S2. This allows the phase shifter 51a to generate the first and second carrier signals LO1 and LO2 having a phase difference of 90 degrees. As an alternative example, the MOS transistor Tr11 may be connected in parallel to the resistor R1 of the LPF 12. In this case, the control signal S4 is supplied to the gate of the MOS transistor Tr11.

(Fourth Embodiment)

Figure 15:
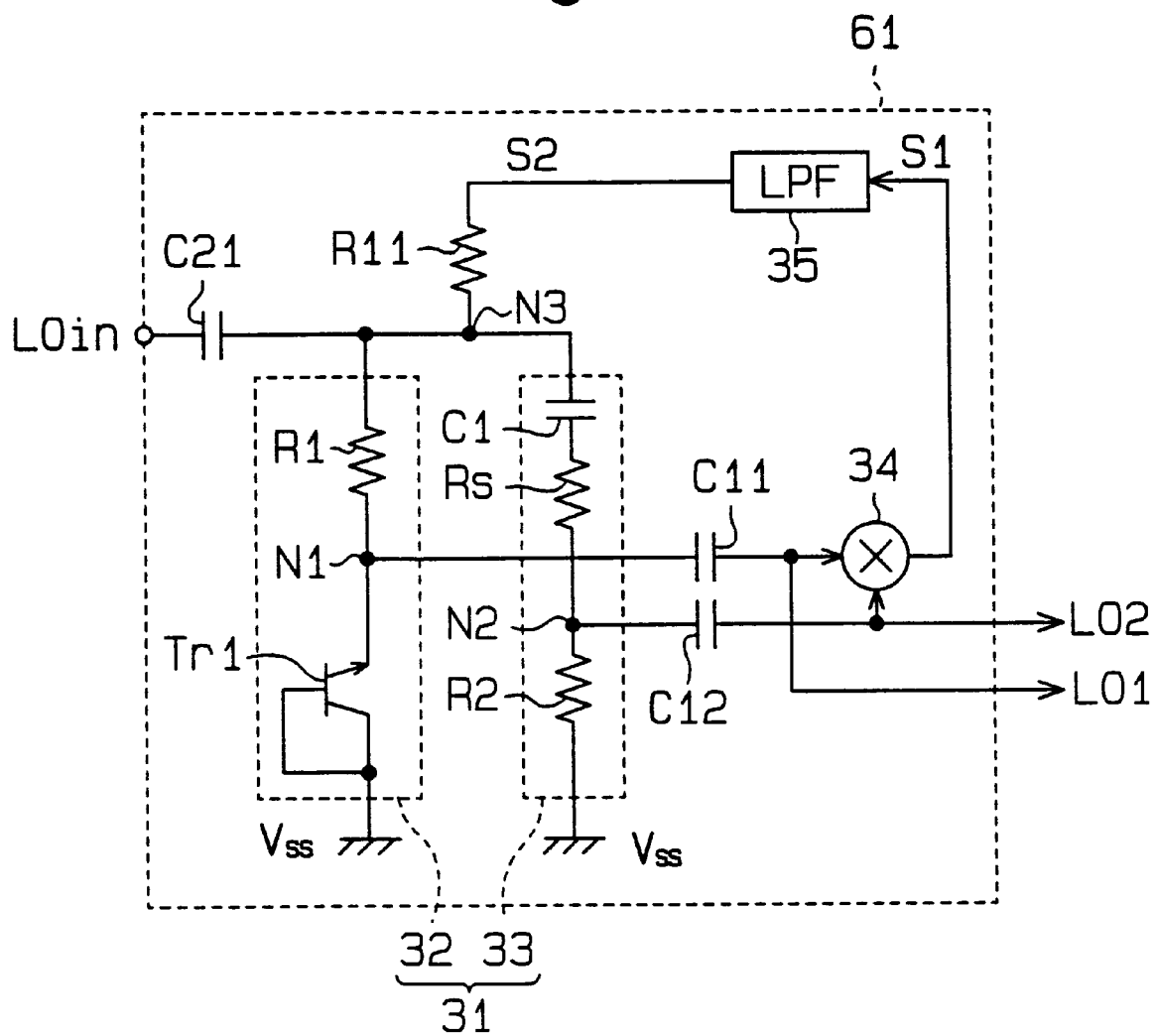
FIG. 15 is a circuit diagram of a phase shifter according to a fourth embodiment of the present invention.

FIG. 15 is a circuit diagram of a phase shifter 61 according to a fourth embodiment of the present invention. The phase shifter 61 includes the CR phase shifter 31 including the LPF 32 and the HPF 33, the phase difference detection circuit 34, the second LPF 35, capacitors C11 and C12, a capacitor C21, and a resistor R11. Any one of the CR phase shifters 31a to 31d (FIGS. 8–11), and 52 (FIG. 13) may also be used instead of the CR phase shifter 31.

The input signal LOin is applied to the first terminal of the capacitor C21 and the second terminal of the capacitor C21 is connected to the LPF 32 and the HPF 33. This allows the LPF 32 and the HPF 33 to receive the input signal LOin via the capacitor C21.

The first terminal of the resistor R11 is connected to the LPF 35, and the second terminal of the resistor R11 is connected to a node N3 between the HPF 33 and the capacitor C21. The LPF 32 is connected to the node N3.

The signal S1 of the phase difference detection circuit 34 is supplied to the LPF 32 and the control signal S2 from the second LPF 35 is supplied to the LPF 32 and the HPF 33 via the resistor R11. The control signal S2 is applied to the node N1 via the resistor R1 of the LPF 32. Thus, the junction capacitance of the transistor Tr1 varies according to the voltage of the control signal S2. Thus, the junction capacitance of the transistor Tr1 is feedback-controlled by the control signal S2 generated based on the phase difference of the first and second carrier signals LO1 and LO2. This allows the phase shifter 61 to generate the first and second carrier signals LO1 and LO2 having a phase difference of 90 degrees.

The capacitor C21 connects the input terminal of the phase shifter 61 and the LPF 32 and HPF 33 by AC coupling. The AC input signal LOin passes through the capacitor C21 and is supplied to the LPF 32 and the HPF 33. However, the DC control signal S2 does not pass through the capacitor C21. Accordingly, the capacitor C21 prevents the control signal S2 from being supplied to the input terminal.

(Fifth Embodiment)

Figure 16:
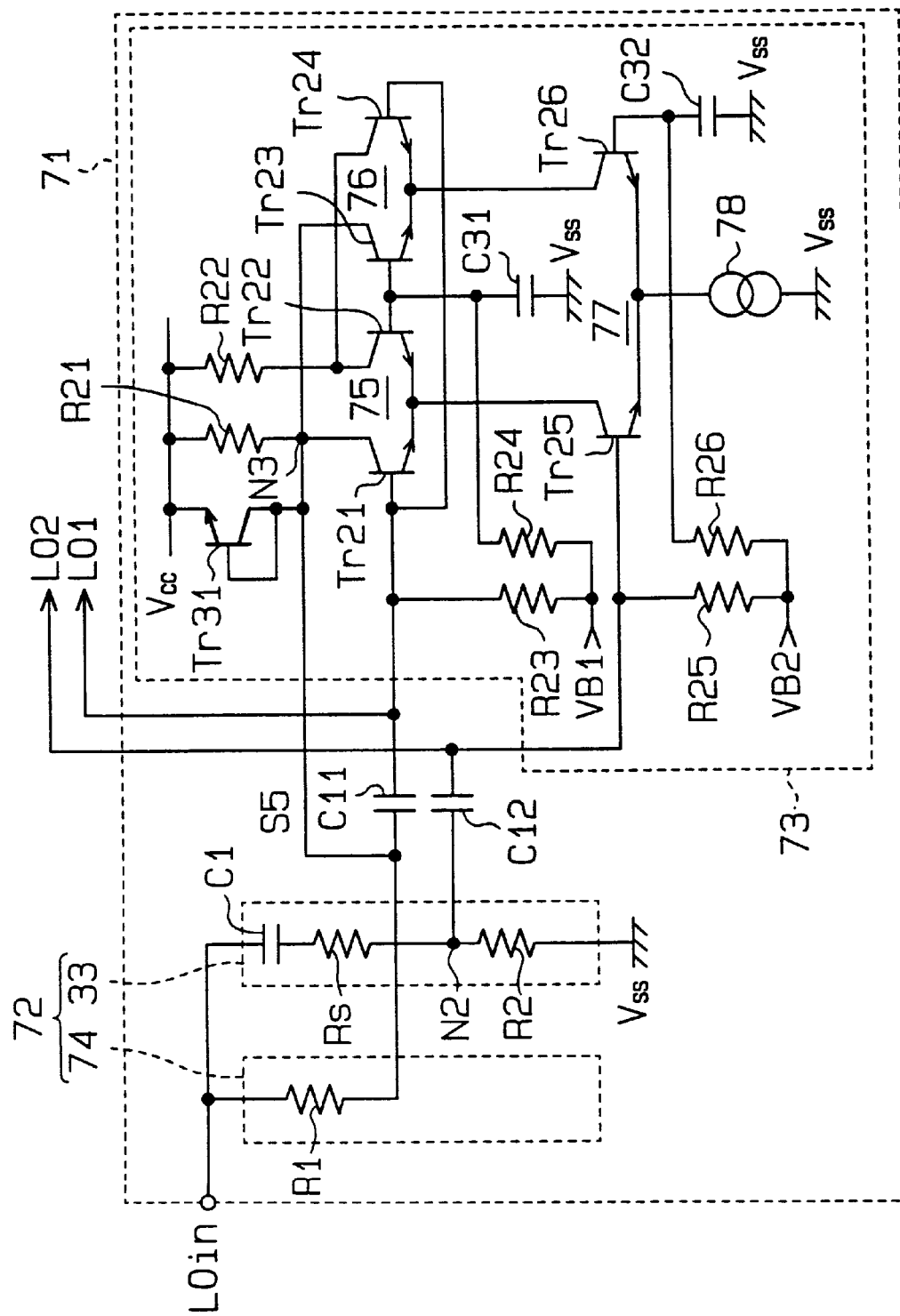
FIG. 16 is a circuit diagram of a phase shifter according to a fifth embodiment of the present invention.

FIG. 16 is a circuit diagram of a phase shifter 71 according to a fifth embodiment of the present invention. The phase shifter 71 includes a CR phase shifter 72, the capacitors C11 and C12, and a phase difference detection circuit 73.

The CR phase shifter 72 includes an LPF 74 and the HPF 33. The LPF 74 includes the resistor R1. The first terminal of the resistor R1 is connected to the input terminal of the phase shifter 71 and the capacitor C1 of the HPF 33, and the second terminal of the resistor R1 is connected to the phase difference detection circuit 73 via the capacitor C11. The LPF 74 receives the input signal LOin and supplies the first carrier signal LO1 to the phase difference detection circuit 73 via the capacitor C11.

The HPF 33 is a differential circuit including the capacitor C1 and the resistor R2. The first terminal of the capacitor C1 is connected to the input terminal, and the second terminal of the capacitor C1 is connected to the low potential power supply VSS via the resistor R2. The capacitor C1 has the parasitic resistor Rs. The node N2 between the capacitor C1 and the resistor R2 is connected to the phase difference detection circuit 73 via the capacitor C12. The HPF 33 receives the input signal Loin and supplies the second carrier signal LO2 to the phase difference detection circuit 73 via the capacitor C12.

The phase difference detection circuit 73 is preferably a double balanced mixer (DBM). The phase difference detection circuit 73 includes NPN transistors Tr21 to Tr26 and Tr31, resistors R21 to R26, capacitors C31 and C32, and a constant current source 78.

The first and second transistors Tr21 and Tr22 have their emitters connected together to form a first differential amplifier 75. The collectors of the first and second transistors Tr21 and Tr22 are connected to a high potential power supply Vcc via the resistors R21 and R22. A first bias voltage VB1 is supplied to the bases of the first and second transistors Tr21 and Tr22 via the resistors R23 and R24, respectively. The first carrier signal LO0 is further supplied to the base of the first transistor Tr21. The base of the second transistor Tr22 is connected to the low potential power supply VSS via the capacitor C31.

The third and fourth transistors Tr23 and Tr24 have their emitters connected together to form a second differential amplifier 76. The collectors of the third and fourth transistors Tr23 and Tr24 are connected to the high potential power supply Vcc via the resistors R21 and R22. A first bias voltage VB1 is supplied to the bases of the third and fourth transistors Tr23 and Tr24 via the resistors R23 and R24. The base of the third transistor Tr23 is connected to the low potential power supply VSS via the capacitor C31. The first carrier signal LO1 is supplied to the base of the fourth transistor Tr24.

The fifth and sixth transistors Tr25 and Tr26 have their emitters connected together to form a third differential amplifier 77. The emitters of the fifth and sixth transistors Tr25 and Tr26 are further connected to the low potential power supply VSS via the constant current source 78. The collector of the fifth transistor Tr25 is connected to the emitters of the first and second transistors Tr21 and Tr22. The collector of the sixth transistor Tr26 is connected to the emitters of the third and fourth transistors Tr23 and Tr24. A second bias voltage VB2 is supplied to the bases of the fifth and sixth transistors Tr25 and Tr26 via the resistors R25 and R26, respectively. The second carrier signal LO2 is further supplied to the base of the fifth transistor Tr25. The base of the sixth transistor Tr26 is connected to the low potential power supply VSS via the capacitor C32.

The node N3 between the first transistor Tr21 and the resistor R21 is the output terminal of the phase difference detection circuit 73. A control signal S5 based on the phase difference of the first and second carrier signals LO1 and LO2 is applied to the node between the resistor R1 and capacitor C11 of the LPF 74 from the output terminal.

An NPN transistor Tr31 has a collector connected to the node N3, an emitter connected to the high potential power Vcc, and a base connected to its own collector. The transistor Tr31 has a junction capacitance that corresponds to the difference between the voltage of the high potential power Vcc and the voltage of the node N3 (i.e., the voltage of the control signal S5). Connecting the transistor Tr31 between the high potential power Vcc and the node N3 is equivalent to connecting a transistor between the node N3 and the low potential power supply VSS in the AC region. Accordingly, the junction capacitance of the transistor Tr31 is equivalent to the capacitance of the LPF 74 (i.e., the junction capacitance of the transistor Tr1 of FIG. 6). Hence, the phase difference detection circuit 73 outputs the control signal S5 using the transistor Tr31 as a load. Thus, the phase of the first carrier signal LO0 of the LPF 74 varies in accordance with the control signal S5. Such feedback control allows the phase shifter 71 to generate the first and second carrier signals LO1 and LO2 having a phase difference of 90 degrees.

Figure 17:
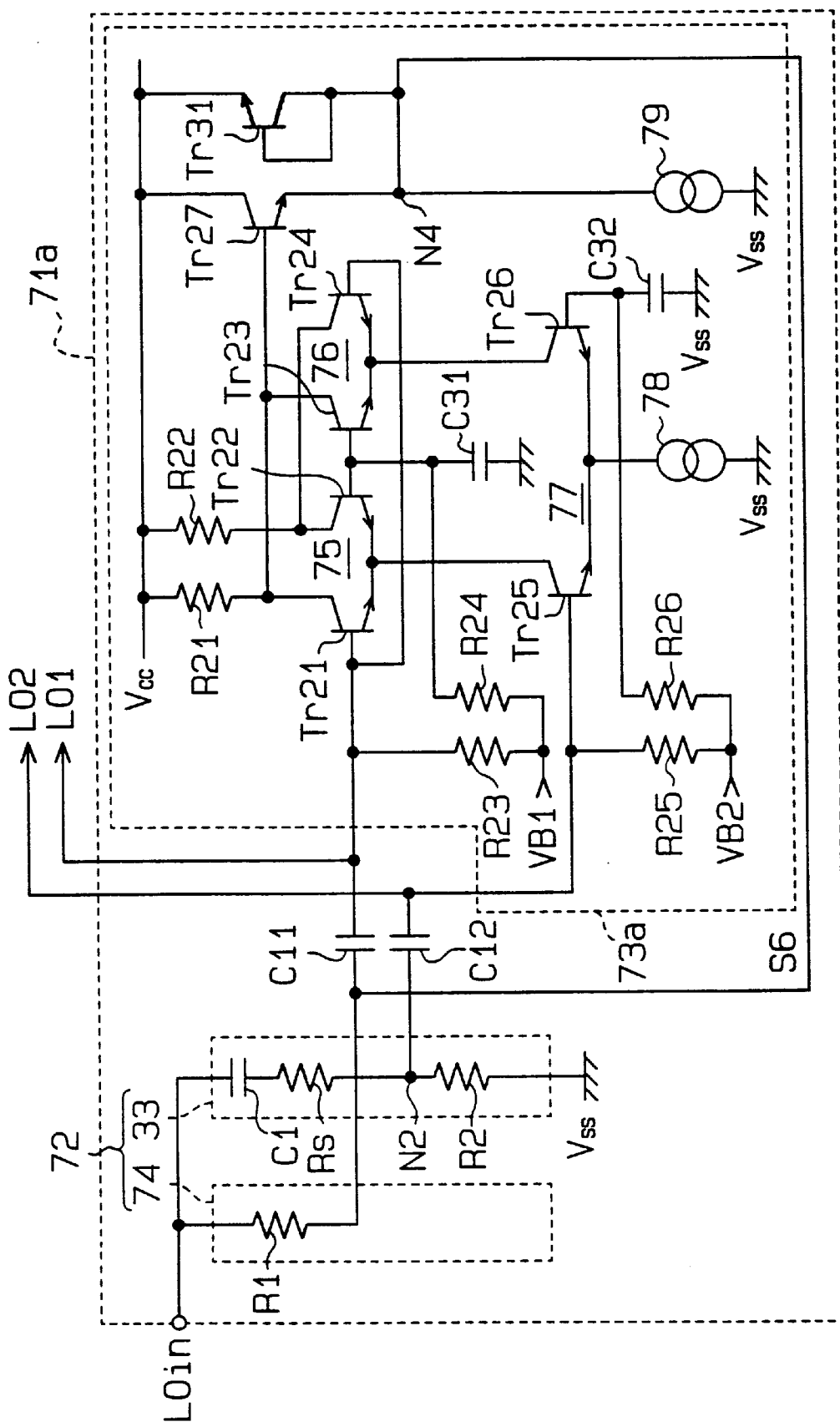
FIG. 17 is a circuit diagram of a modified phase shifter according to the fifth embodiment.

FIG. 17 shows the modification example according to the fifth embodiment. A phase difference detection circuit 73a is a circuit in which a seventh transistor Tr27 as an output transistor and a second constant current source 79 are appended to the phase difference detection circuit 73. The seventh transistor Tr27 has a collector connected to the high potential power supply Vcc, an emitter connected to the low potential power supply VSS via the second constant current source 79, and a base connected to the node N3. The transistor Tr31 is connected between the high potential power supply Vcc and the node N4 located between the transistor Tr27 and the second constant current source 79. The node N4 is the output terminal of the phase difference detection circuit. The control signal S4 from the output terminal is supplied to the node between the resistor R1 and the capacitor C11 of the LPF 74.

The transistor Tr31 has a junction capacitance according to the voltage difference between the high potential power supply Vcc and the voltage of the node N4 and operates as the load of the phase difference detection circuit 73a. Connecting the transistor Tr31 between the high potential power supply Vcc and the node N4 is equivalent to connecting a transistor between the node N4 and the low potential power supply VSS in the AC region. By outputting a control signal S6 using the transistor Tr31 as a load, the first and second carrier signals LO1 and LO2 having a phase difference of 90 degrees are generated.

Figure 18:
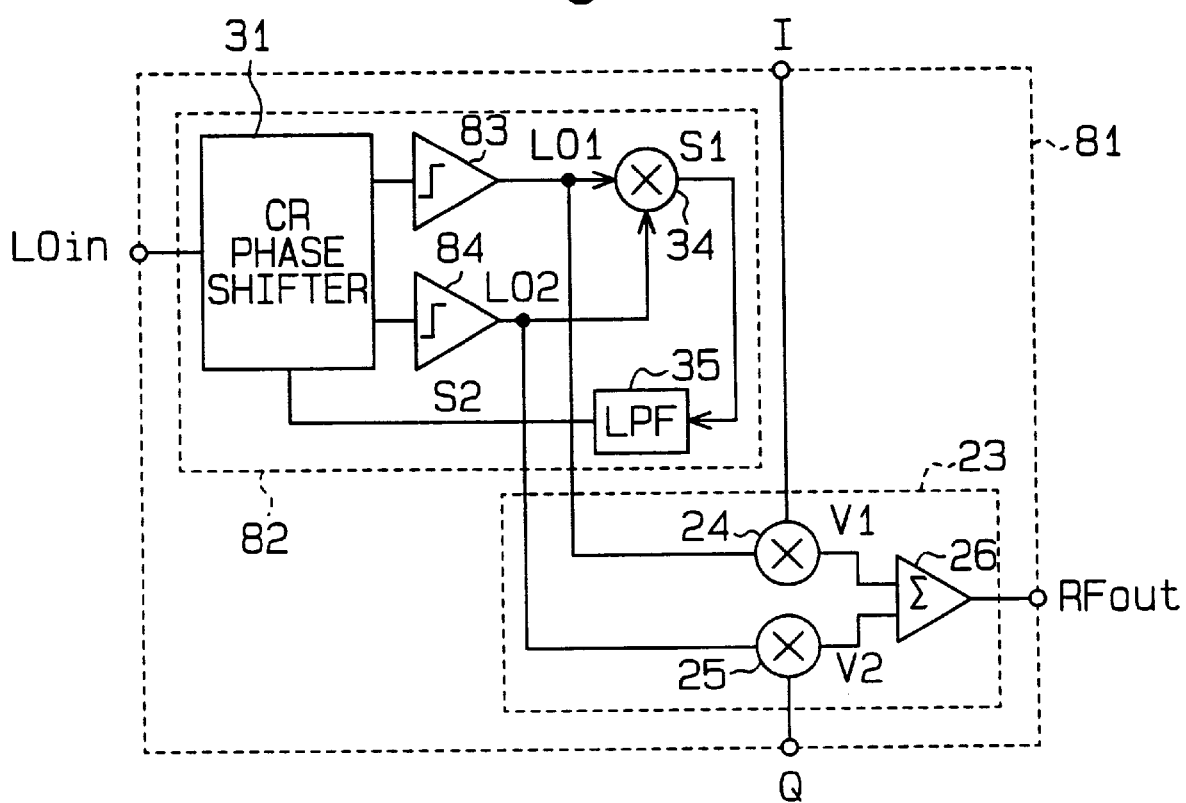
FIG. 18 is a schematic bock diagram of a quadrature modulator according to a sixth embodiment of the present invention.

FIG. 18 is a schematic block diagram of a quadrature modulator 81 used in a digital mobile communication device. The quadrature modulator 81 includes a phase shifter 82 and the quadrature modulation unit 23, all of which may be integrated on a single semiconductor substrate. The quadrature modulation unit 23 includes the first and second modulation mixers 24 and 25 and the adder 26. The phase shifter 82 includes the CR phase shifter 31, the phase difference detection circuit 34, the second LPF 35, and limiter amps 83 and 84. The CR phase shifter 31, the phase difference detection circuit 34, and the second LPF 35 have the same configuration as the phase shifter 22 of FIG. 6. Accordingly, the phase shifters 22a to 22d, 41, 51, 51a, 61, 71, and 71a may also be used instead of the phase shifter 22.

The first and second limiter amps 83 and 84 receive signals generated by the CR phase shifter and amplify the signals at a predetermined upper limit amplitude and a predetermined lower limit amplitude. The first and second limiter amps 83 and 84 allow the first and second carrier signals LO0 and LO2 having substantially the same amplitude to be supplied to the phase difference detection circuit 34. The phase difference detection circuit 34 supplies the control signal S1 based on the phase difference of the first and second carrier signals LO0 and LO2 to the CR phase shifter 31 via the LPF 35.

In the sixth embodiment, the quadrature modulator 81 modulates the first and second base band signals I and Q at the same amplitude by providing the first and second limiter amps 83 and 84 that generate the first and second carrier signals LO1 and LO2 having the same amplitude.

(Seventh Embodiment)

Figure 4:
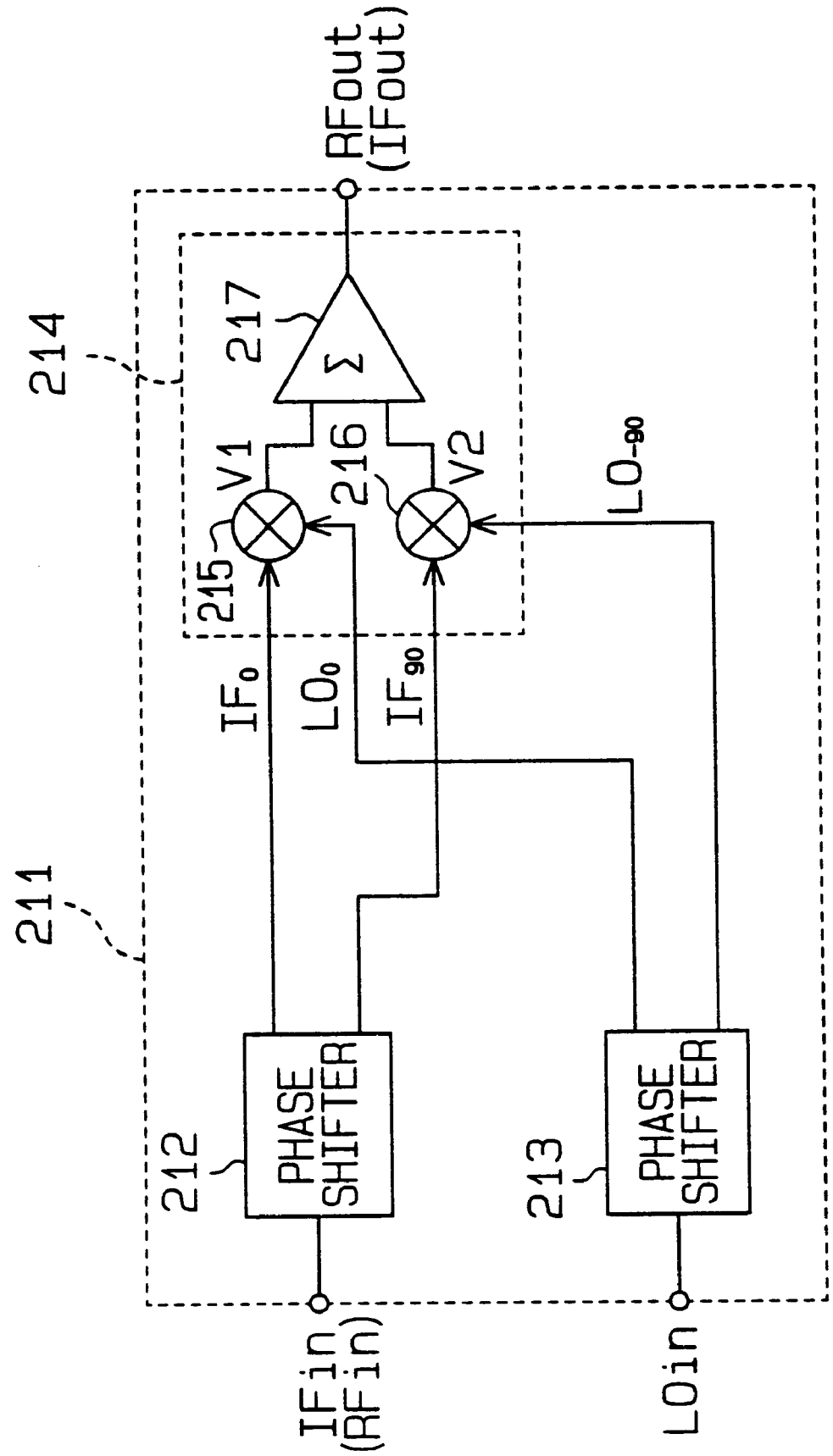
FIG. 4 is a schematic block diagram of a conventional mixer.
Figure 19:
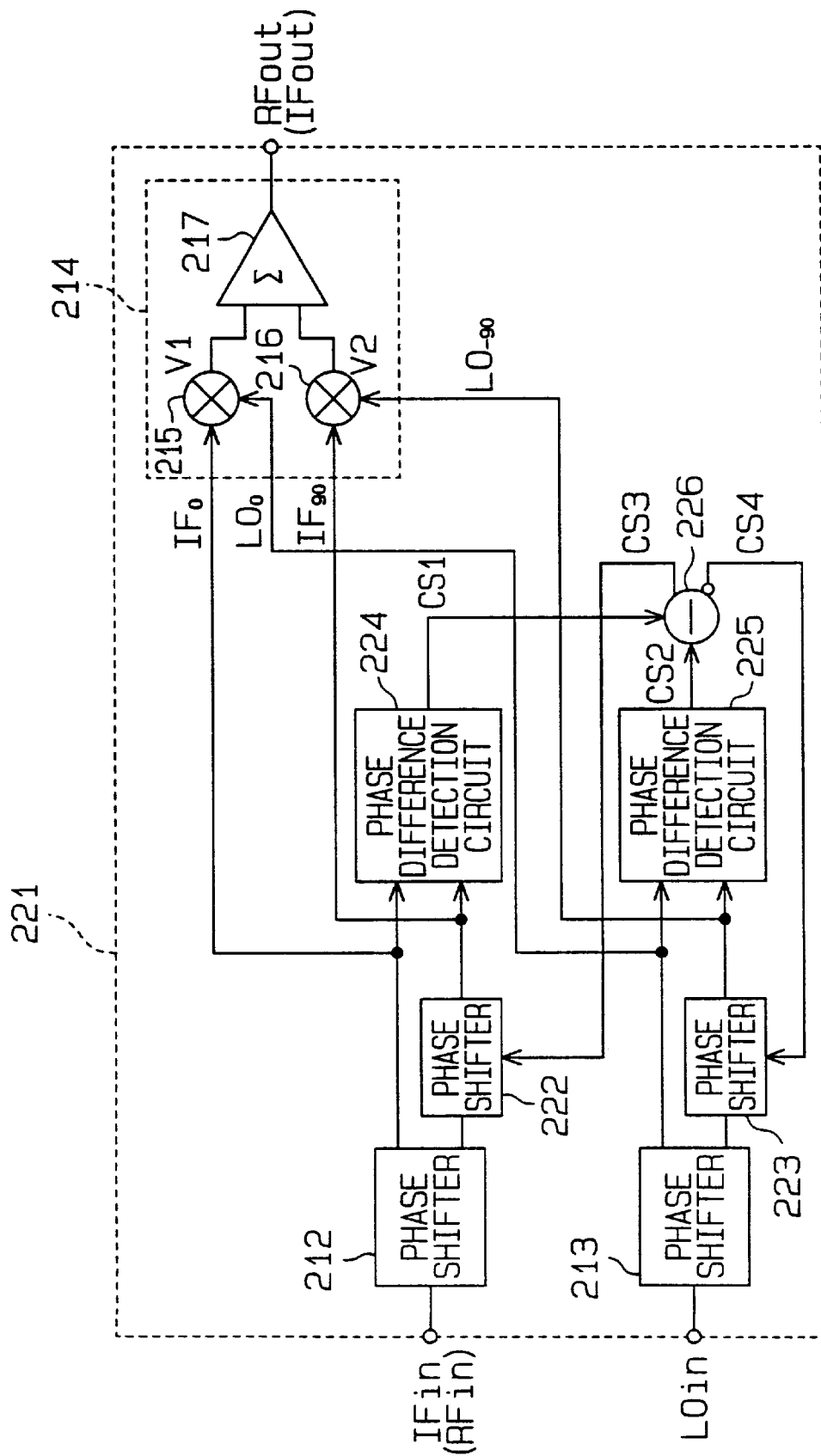
FIG. 19 is a block circuit diagram of an image suppression mixer according to a seventh embodiment of the present invention.

FIG. 19 is a schematic block circuit diagram of an image suppression mixer (hereinafter referred to as mixer circuit) 221 according to a seventh embodiment of the present invention. The mixer circuit 221 includes first and second phase shifters 212 and 213, third and fourth phase shifters 222 and 223, first and second phase difference detection circuits 224 and 225, a differential circuit 226, and the image suppression circuit 214 (FIG. 4) all of which are preferably formed on a single semiconductor substrate. The image suppression circuit 214 includes the first and second mixers 215 and 216 and the adder 217.

The first phase shifter 212 is preferably a phase shifter according to the flip-flop method. A phase shifter that complies with the CR method may also be used instead of the flip-flop method. The first phase shifter 212 receives an intermediate frequency signal IFin and generates the first intermediate frequency signal IF0 having the same phase as the intermediate frequency signal IFin and the second intermediate frequency signal IF90 having a phase of +90 degrees against the first intermediate frequency signal IF0.

The second phase shifter 213 is preferably a phase shifter according to the flip-flop method. A phase shifter according to the CR method may also be used. The second phase shifter 213 receives the local signal LOin and generates the first local signal LO0 having the same phase as the local signal LOin and the second local signal LO-90 having a phase of −90 degrees against the first local signal LO0.

The third phase shifter 222 receives the second intermediate frequency signal IF90 from the first phase shifter 212 and shifts the phase of the second intermediate frequency signal IF90 to the extent of a predetermined amount in accordance with a first control signal CS3 from the differential circuit 226. In other words, the amount of the shift in the phase of the second intermediate frequency signal IF90 is determined by the first control signal CS3.

The fourth phase shifter 223 receives the second local signal LO-90 from the second phase shifter 213 and shifts the phase of the second local signal LO-90 to the extent of a predetermined amount in accordance with a second control signal CS4 from the differential circuit 226. In other words, the amount of the shift in the phase of the second local signal LO-90 is determined by the second control signal CS4.

The first phase difference detection circuit 224 is preferably a frequency mixer (frequency converter). The first phase difference detection circuit 224 receives the first intermediate frequency signal IF0 from the first shifter 212 and the second intermediate frequency signal IF90 from the third phase shifter 222 and detects the phase difference between the signals IF0 and IF90 to generate a first detection signal CS1 having a DC component according to the detected phase difference.

The second phase difference detection circuit 225 is preferably a frequency mixer (frequency converter). The second phase difference detection circuit 225 receives the first local signal LO0 from the second phase shifter 213 and the second local signal LO-90 from the fourth phase shifter 223 and detects the phase difference between the signals LO0 and LO-90 to generate the second detection signal CS2 having a DC component according to the detected phase difference.

The differential circuit 226 receives the first and second detection signals CS1 and CS2 from the first and second phase difference detection circuits 224 and 225 and calculates the difference between the first and second detection signals CS1 and CS2. The differential circuit 226 generates the first and second control signals CS3 and CS4 for reducing the differences of the first and second detection signals. The second control signal CS4 is an inverse of the first control signal CS3. Accordingly, the phase difference of the first and second local signals LO0 and LO-90 is compensated for by shifting the phase of the second intermediate frequency signal IF90 in accordance with the first control signal CS3 by the third phase shifter 222. In the same manner, the phase differences of the first and second intermediate frequency signals IF0 and IF90 are compensated for by shifting the phase of the second local signal LO-90 in accordance with the second control CS4 by the fourth phase shifter 223. Thus, the phase difference between the first and second intermediate frequency signals IF0 and IF90 and the phase difference between the first and second local signals LO0 and LO-90 are maintained at 90 degrees and effects due to uneven manufacturing in the first and second phase shifters 212 and 213 are reduced. The areas of the circuits 222 to 226 are smaller than the area of the conventional circuit used increase the phase difference accuracy of the output signals of the first and second phase shifters 212 and 213. Accordingly, increase of the circuit area is prevented. Further, since the mixer circuit 221 does not require a coupler, it can be integrated on a single semiconductor substrate.

The first mixer 215 receives the first intermediate frequency signal IF0 from the first phase shifter 212 and the local signal LO0 from the third phase shifter 213 and generates a first modulation signal V1 by mixing the intermediate frequency signal IF0 and the first local signal LO0.

The second mixer 216 receives the second intermediate frequency signal IF90 from the third phase shifter 222 and the second local signal LO-90 from the fourth phase shifter 223 and generates a second modulation signal V2 by mixing the second intermediate frequency signal IF90 and the second local signal LO-90.

The adder 217 receives the first and second modulation signals V1 and V2 from the first and second mixers 215 and 216 and generates the output signal RFout by adding the first and second modulation signals V1 and V2.

Figure 22:
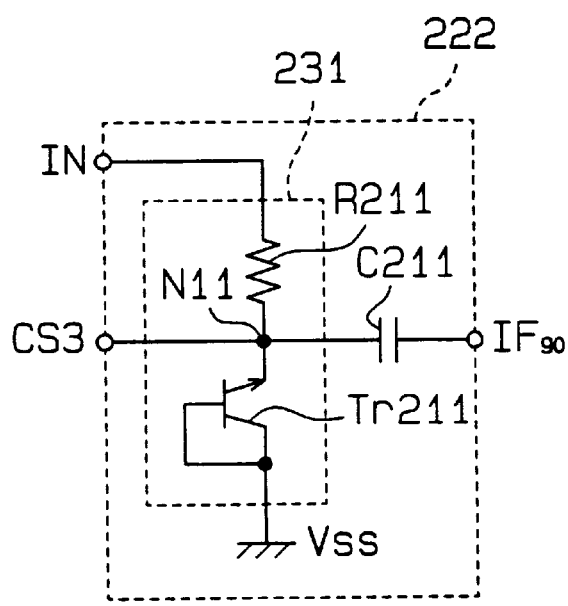
FIG. 22 is a circuit diagram of a phase shifter of the image suppression mixer of FIG. 19.

FIG. 22 is a circuit diagram of the third phase shifter 222. Since the fourth phase shifter 223 preferably has the same configuration as the third phase shifter 222, an illustration and detailed description thereof are omitted. The third phase shifter 222 includes a low pass filter (LPF) 231 and a capacitor C211. The LPF 231 is an integrating circuit that includes a resistor R211 and an NPN transistor Tr211 as a variable element (variable-capacitance element). The first terminal of the resistor R211 is connected to an input terminal that receives the input signal IN of the third phase shifter 222, and the second terminal of the resistor R211 is connected to the emitter of the transistor Tr211. Alternatively, the capacitance element may also be connected in parallel to the transistor Tr211.

The collector of the transistor Tr211 is connected to the low potential power supply VSS, and the base of the transistor Tr211 is connected to its own connector. This allows the transistor Tr211 to have a junction capacitance CJ of the pn junction between the base and emitter. The junction capacitance CJ corresponds to the difference in voltage between the voltage of the low potential power supply VSS and the voltage of a node N11 between the transistor Tr211 and the resistor R211. Accordingly, the junction capacitance of the transistor Tr211 is determined depending on the voltages of the input signal IN and the first control signal CS3. The LPF 231 receives the second intermediate frequency signal IF90, changes the cutoff frequency that is determined depending on the resistance of the resistor R211 and the junction capacitance of the transistor Tr211 in accordance with the voltage of the first control signal CS3, and shifts the phase of the second intermediate frequency signal IF90. In other words, the cutoff frequency is changed by changing the junction capacitance of the transistor Tr211 in accordance with the voltage of the first control signal CS3. Accordingly, the amount of shift of the phase of the second intermediate frequency signal IF90 is determined depending on the voltage of the first control signal CS3.

The capacitor C211 prevents the first control signal CS3 from being included in the second intermediate frequency signal IF90. In other words, the capacitor C211 allows the second intermediate frequency signal IF90 having only the AC component to pass through by AC coupling and interrupts the DC control signal CS2.

Figure 20:
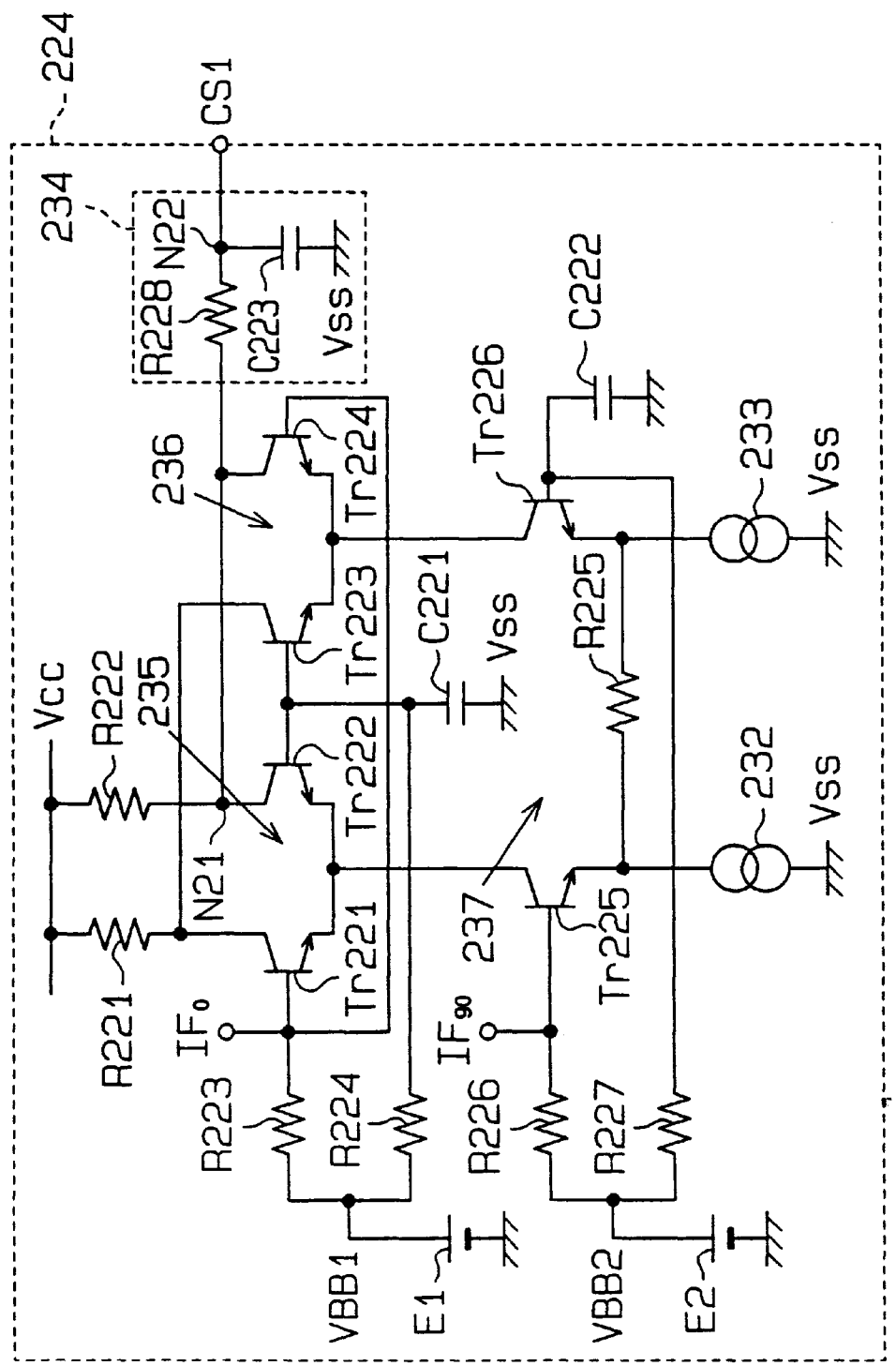
FIG. 20 is a circuit diagram of a phase difference detection circuit of the image suppression mixer of FIG. 19.

FIG. 20 is a circuit diagram of the first phase difference detection circuit 224. Since the second phase difference detection circuit 225 preferably has the same configuration as the first phase difference detection circuit 224, a drawing and detailed description thereof are omitted.

The first phase difference detection circuit 224 includes a double balanced mixer (DBM) and a low pass filter (LPF) 234. The double balanced mixer comprises NPN transistors Tr221 to Tr226, resistors R221 to R227, capacitors C221 and C222, constant current sources 232 and 233, and reference power supplies E1 and E2.

The first and second transistors Tr221 and Tr222 have their emitters connected together and form a first differential amplifier 235. The collectors of the first and second transistors Tr221 and Tr222 are connected to the high potential power supply Vcc via the resistors R221 and R222. The bases of the first and second transistors Tr221 and Tr222 are connected to the first reference power supply E1, which generates a first bias voltage VBB1, via the resistors 223 and R224. The first local signal LO1 is supplied to the base of the first transistor Tr221. The base of the second transistor Tr222 is connected to the low potential power supply VSS via the capacitor C221.

The third and fourth transistors Tr223 and Tr224 have their emitters connected together and form a second differential amplifier 236. The collectors of the third and fourth transistors Tr223 and Tr224 are connected to the high potential power supply Vcc via the resistors R221 and R222. The bases of the third and fourth transistors Tr223 and Tr224 receive the first bias voltage VBB1 via the resistors R223 and R224. The base of the third transistor Tr223 is connected to the low potential power supply VSS via the capacitor C221. The base of the fourth transistor Tr224 receives the first local signal LO0.

The fifth and sixth transistors Tr225 and Tr226 have their emitters connected together via the resistor R225 and form a third differential amplifier 237. The emitters of the fifth and sixth transistors Tr225 and Tr226 are connected to the low potential power supply VSS via the constant current sources 232 and 233.

The collector of the fifth transistor Tr225 is connected to the emitters of the first and second transistors Tr221 and Tr222. The collector of the sixth transistor Tr226 is connected to the emitters of the third and fourth transistors Tr223 and Tr224. The bases of the fifth and sixth transistors Tr225 and Tr226 receive a second bias power supply VBB2 via the resistors R225 and R226. The base of the fifth transistor Tr225 further receives the second local signal LO2. The base of the sixth transistor Tr226 is connected to the low potential power supply VSS via the capacitor C222.

The node N21 between the second transistor Tr222 and the second resistor R222 is connected to the LPF 234. The LPF 234 is an integrating circuit that includes the resistor R228 and the capacitor C223 connected in series. The first terminal of the resistor R228 is connected to the node N21 and the second terminal of the resistor R228 is connected to the first terminal of the capacitor C223. The second terminal of the capacitor C228 is connected to the low potential power supply VSS.

The LPF 234 outputs a first detection signal CS1 from the node N21 between the resistor R228 and the capacitor C223. The first detection signal CS1 is generated by smoothing the voltage of the node N21 and has a DC component.

The signal S (N21) at the node N21 of the phase difference detection circuit 224 is obtained in accordance with the following equation (6).

$$S(N21) = \cos(2\pi f_{IN} t + \phi 1) \times \cos(2\pi f_{IN} t + \phi 2)$$

$$= \frac{1}{2}[\cos\{2\pi(2f_{IN})t + \phi 1 + \phi 2\} + \cos(\phi 1 - \phi 2)]$$

The LPF 234 removes the high frequency component (first term of Equation (6)) of the signal S (N21). The first detection signal CS1 includes the DC component ({cos(φ1−φ2)}/2) of the signal of the node N21. This DC component corresponds to the phase differences of the first and second intermediate frequency signals IF0 and IF90.

Figure 21:
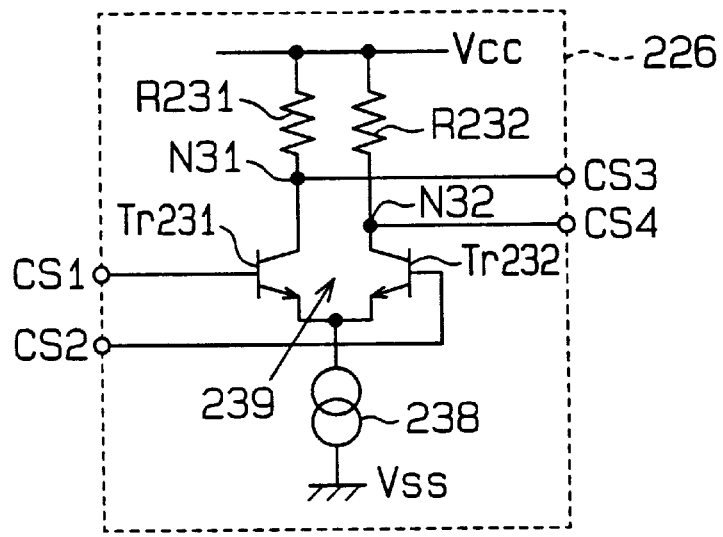
FIG. 21 is a circuit diagram of a differential circuit of the image suppression mixer of FIG. 19.

FIG. 21 is a circuit diagram of the differential circuit 226. The differential circuit 226 includes NPN transistors Tr231 and Tr232, resistors R231 and R232, and a constant current source 238.

The first and second transistors Tr231 and Tr232 have their emitters connected together and form a differential amplifier 239. The emitters of the first and second transistors Tr231 and Tr232 are also connected to the low potential power supply VSS via the constant current source 238. The collectors of the first and second transistors Tr231 and Tr232 are connected to the high potential power supply Vcc via the resistors R221 and R222. The base of the first transistor Tr231 receives the first detection signal CS1 and the base of the second transistor Tr232 receives the second detection signal CS2.

The differential circuit 226 outputs the first control signal CS3 from the node N31 (first output terminal) between the resistor R231 and the transistor Tr231. The differential circuit 226 further outputs the second control signal CS4 that is an inverse signal of the first control signal CS3 from the node N32 (second output terminal) between the resistor R232 and the transistor Tr232.

When the first and second phase shifters 212 and 213 have no uneven manufacturing and generate the output signal having a phase difference of substantially 90 degrees, it is preferable that the first and second bias voltages VBB1 and VBB2 of the phase difference detection circuits 224 and 225 and the voltages of the first and second control signals CS3 and CS4 correspond to one another. Thus, the first and second intermediate frequency signals IF0 and IF90 and the first and second local signals LO0 and LO-90 having an accurate phase difference of 90 degrees are obtained by a feedback loop including the first and second phase difference detection circuits 224 and 225, the differential circuit 226, and the third and fourth phase shifters 222 and 223.

Next, the operation of the mixer circuit 221 is described. In this example, the phase difference of the first and second intermediate signals IF0 and IF90 is 93 degrees and the phase difference of the first and second local signals LO0 and LO-90 is −88 degrees.

The first phase difference detection circuit 224 outputs the first detection signal CS1 of the phase difference of the first and second intermediate frequency signals IF0 and IF90. The second phase difference detection circuit 225 outputs the second detection signal CS2 of the phase difference between the first and second local signals LO0 and LO-90. The differential circuit 226 outputs the first and second control signals CS3 and CS4 in accordance with the first and second detection signals CS1 and CS2.

The third phase shifter 222 shifts the phase of the second intermediate frequency signal IF90 in accordance with the first control signal CS3 so that the phase difference between the first and second intermediate frequency signals IF0 and IF90 is 90 degrees. The fourth phase shifter 223 shifts the phase of the second local signal LO-90 in accordance with the second control signal CS4 so that the phase difference of the first and second local signals LO0 and LO-90 is 90 degrees.

The image suppression circuit 214 receives the first and second intermediate frequency signals IF0 and IF90 and the first and second local signals LO0 and LO-90 and outputs the modulation output signal RFout.

When the mixer circuit 221 is used as a down-converter, the first phase shifter 212 receives the high frequency input signal RFin. The input signal RFin may be a signal received by a communication device. The mixer circuit 11 outputs the output signal IFout having a lower intermediate frequency than the input signal RFin by mixing the input signal RFin and the local signal LOin having a local oscillation frequency.

Figure 23:
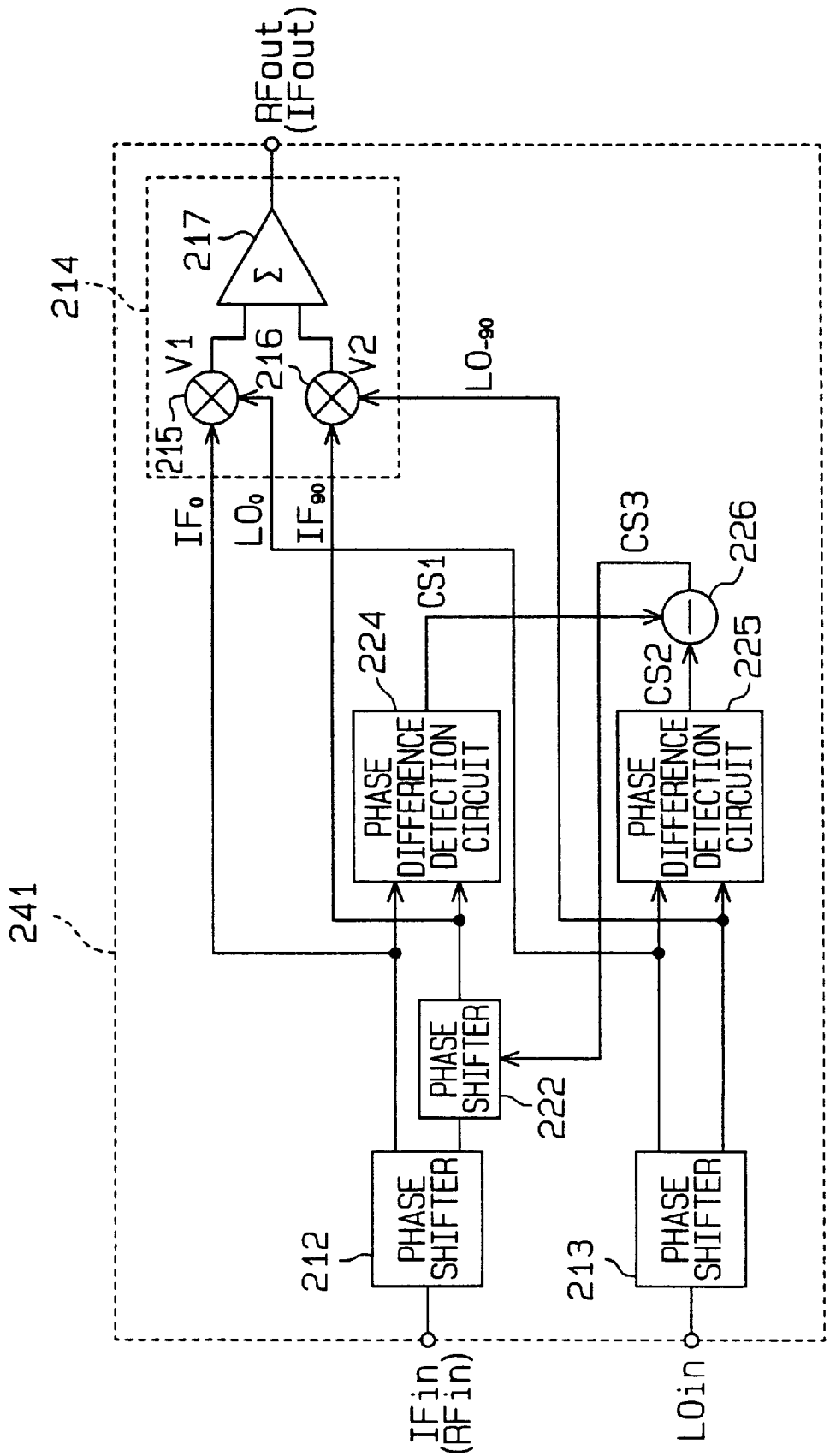
FIG. 23 is a block circuit diagram of a first modified image suppression mixer according to the seventh embodiment.

FIG. 23 is a block diagram of a mixer circuit 241 in a first modification example of the mixer circuit 221 of FIG. 19. The mixer circuit 241 comprises the third phase shifter 222 connected between the first phase shifter 212 and the first phase difference detection circuit 224, but does not include the fourth phase shifter 223. In this case, the differential circuit 226 supplies the first control signal CS1 to the third phase shifter 222. Even with this configuration, effects due to uneven manufacturing of the first and second phase shifters 212 and 213 are reduced by the third phase shifter 222. Specifically, when the phase difference of the first and second intermediate frequency signals IF0 and IF90 is 93 degrees and the phase difference of the first and second local signals LO0 and LO-90 is −88 degrees, the phase of the second intermediate frequency signal IF90 for the phase of the first intermediate frequency signal IF0 is corrected to 92 degrees by the third phase shifter 222. This correction allows the phase difference of the first and second local signals LO0 and LO-90 to be canceled.

Figure 24:
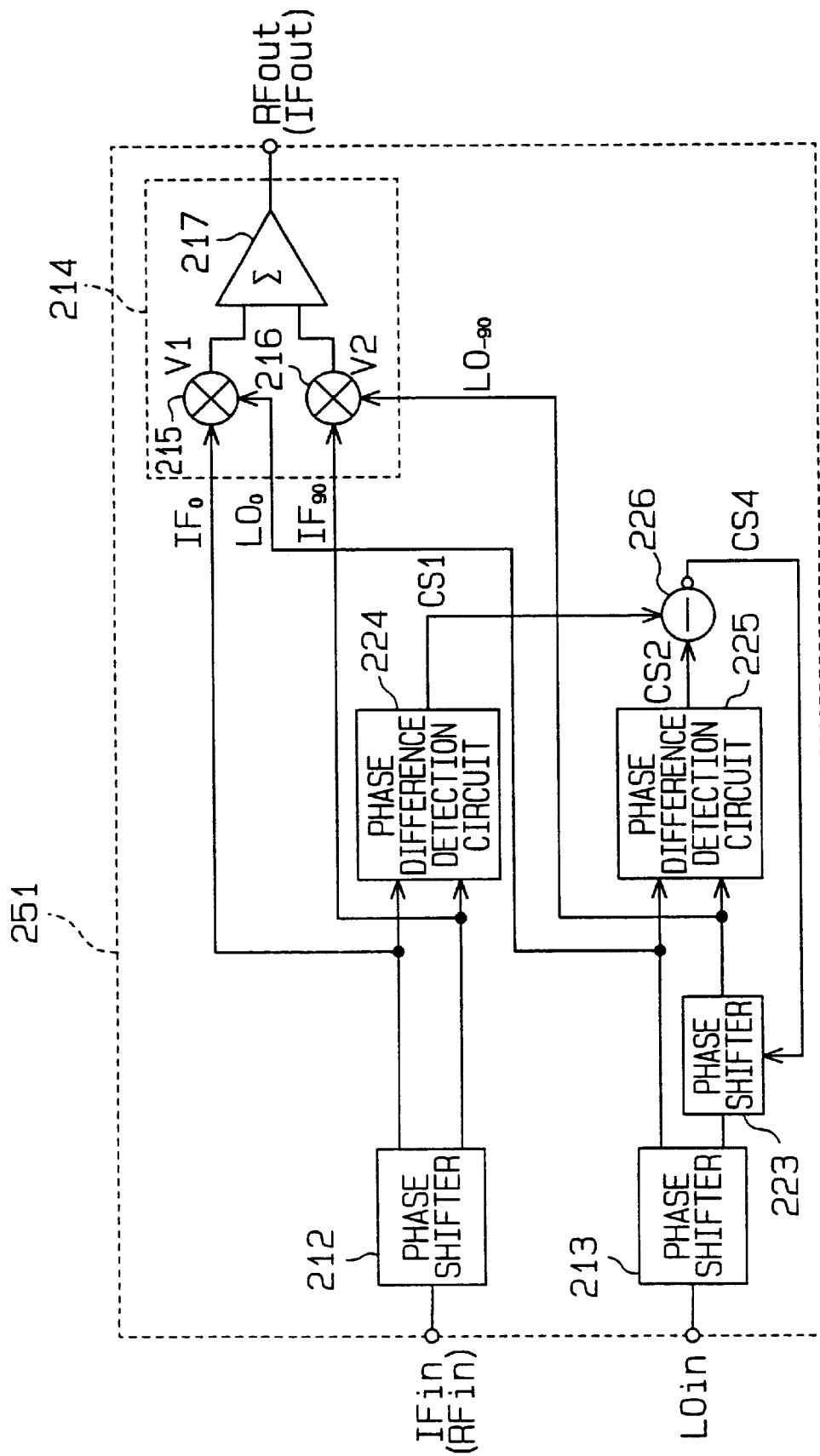
FIG. 24 is a block circuit diagram of a second modified image suppression mixer according to the seventh embodiment.

FIG. 24 is a block diagram of a mixer circuit 251 in a second modification example. The mixer circuit 251 comprises the phase shifter 223 connected between the second phase shifter 213 and the second phase difference detection circuit 225. For example, when the phase difference of the first and second intermediate frequency signals IF0 and IF90 is 93 degrees and the phase difference of the first and second local signals LO0 and LO-90 is −88 degrees, the phase of the second local signal LO-90 for the phase of the first local signal LO0 is corrected to −87 degrees by the phase shifter 223. This correction allows the phase difference of the first and second intermediate frequency signals IF0 and IF90 to be canceled.

As another modification example, a phase shifter may also be provided so that the phase of the first intermediate frequency signal IF0 and the phase of the first local signal IF0 are shifted.

(Eighth Embodiment)

Figure 25:
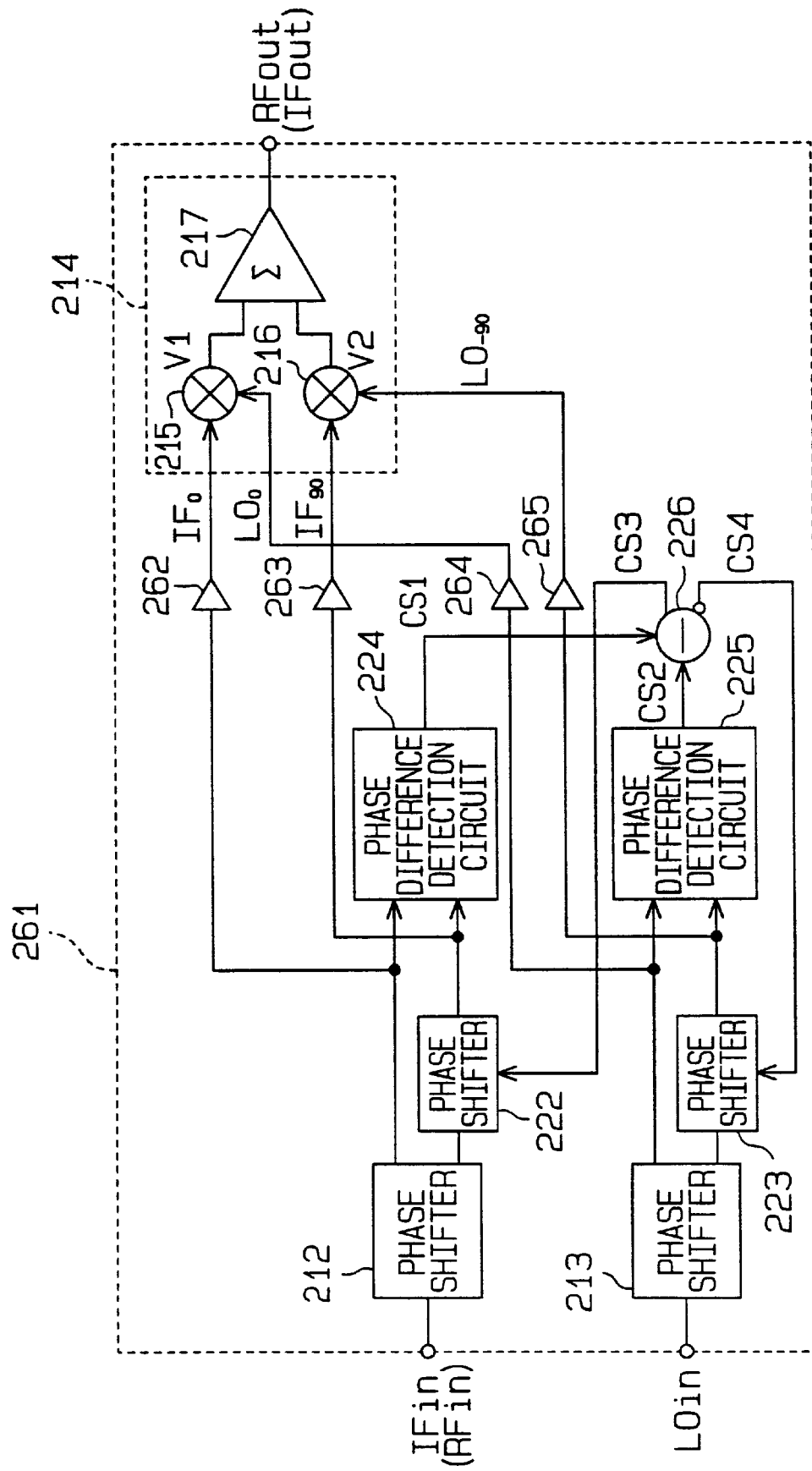
FIG. 25 is a block circuit diagram of an image suppression mixer according to an eighth embodiment of the present invention.

FIG. 25 is a block diagram of a mixer circuit 261 according to an eighth embodiment of the present invention. The mixer circuit 261 is similar to the mixer circuit 222 (FIG. 19) and further comprises first to fourth limiter amps 262 to 265.

The first amp 222 is connected between the first phase shifter 212 and the first mixer 215 and receives the first intermediate frequency signal IF0 from the first phase shifter 212 to generate the amplified first intermediate frequency signal IF0 having the predetermined amplitude.

The second amp 263 is connected between the third phase shifter 222 and the second mixer 216 and receives the second intermediate frequency signal IF90 from the third phase shifter 222 to generate the amplified second intermediate frequency signal IF90 having the predetermined amplitude.

The third amp 264 is connected between the second phase shifter 213 and the first mixer 215 and receives the first local signal LO0 from the second phase shifter 213 to generate the amplified first local signal LO0 having the predetermined amplitude.

The fourth amp 265 is connected between the fourth phase shifter 223 and the second mixer 216 and receives the second local signal LO-90 from the fourth phase shifter 223 to generate the amplified second local signal LO-90 having the predetermined amplitude.

The first and second intermediate frequency signals IF0 and IF90 having the same amplitude are obtained by the first and second amps 262 and 263, and the first and second local signals LO0 and LO-90 having the same amplitude are obtained by the third and fourth amps 264 and 265. Accordingly, the image suppression circuit 214 performs accurate and sure image suppression.

Figure 26:
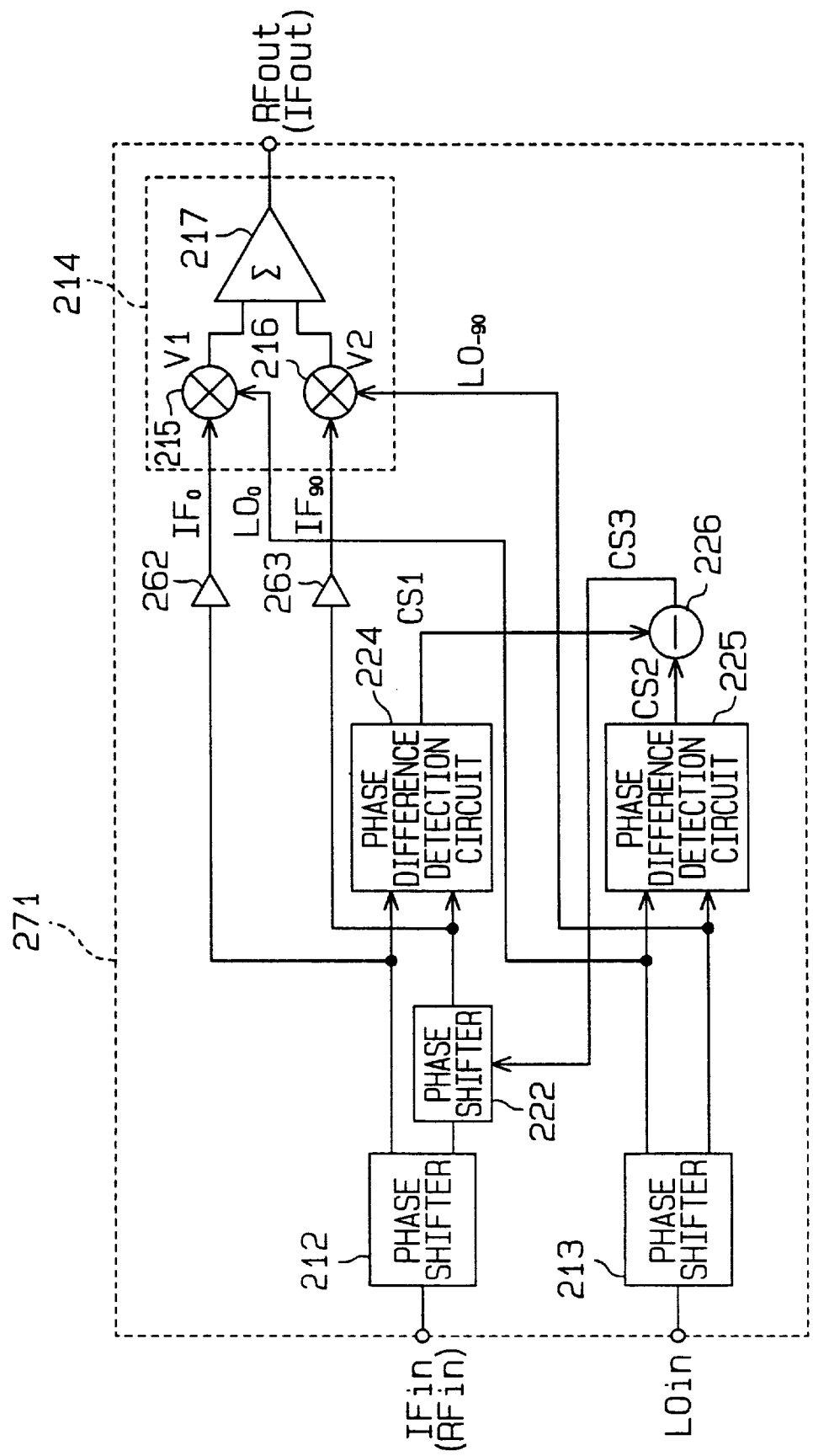
FIG. 26 is a block circuit diagram of a first modified image suppression mixer according to the eighth embodiment.

FIG. 26 is a block diagram of a mixer circuit 271 in a first modification example of the mixer circuit 261. The mixer circuit 271 includes the first amp 262 connected between the first phase shifter 212 and the first mixer 215 and the second amp 263 connected between the third phase shifter 222 and the second mixer 216.

Figure 27:
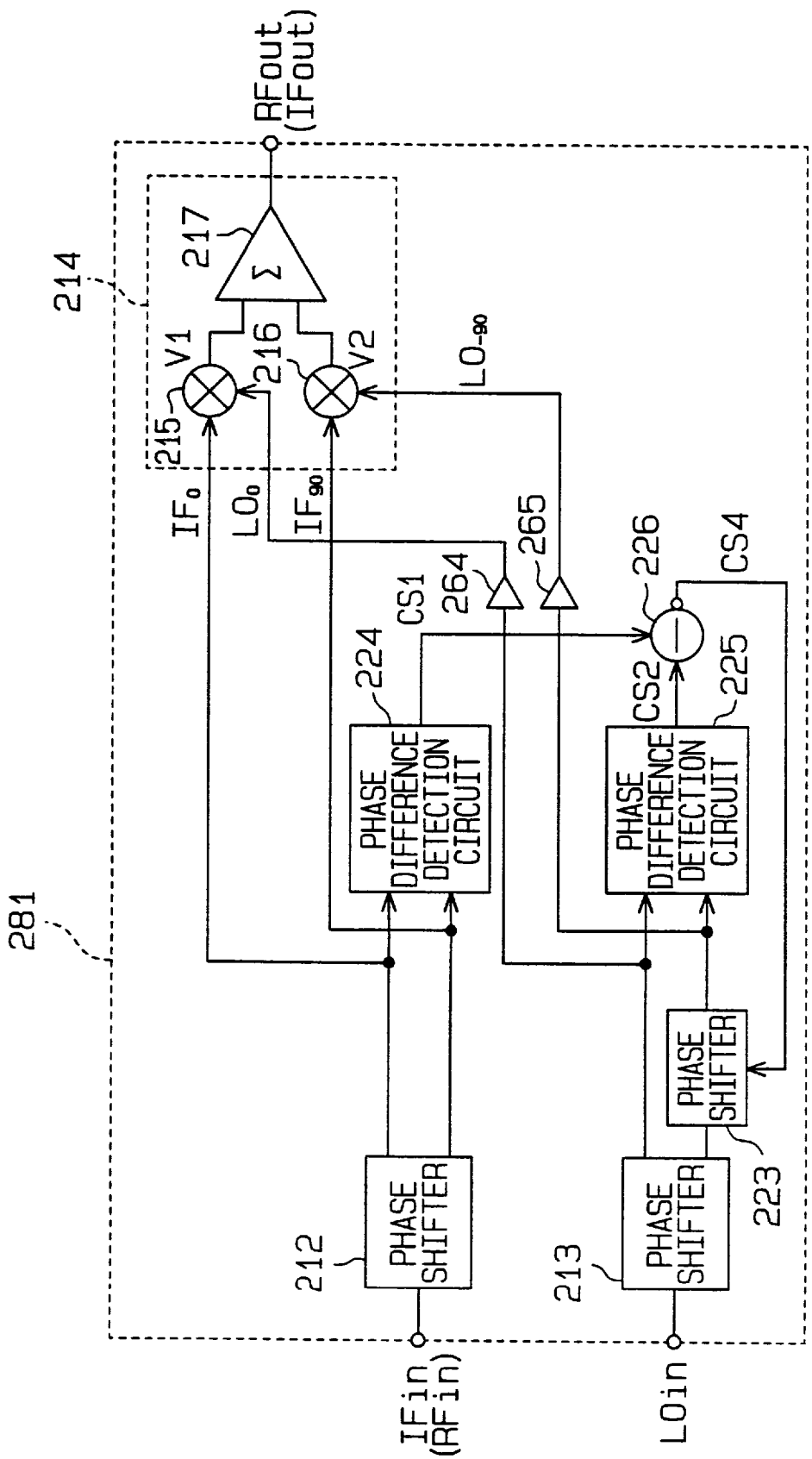
FIG. 27 is a block circuit diagram of a second modified image suppression mixer according to the eighth embodiment.

FIG. 27 is a block diagram of a mixer circuit 281 in a second modification example of the mixer circuit 261. The mixer circuit 281 includes the first amp 264 connected between the second phase shifter 213 and the first mixer 215 and the second amp 265 connected between the fourth phase shifter 223 and the second mixer 216.

(Ninth Embodiment)

Figure 28:
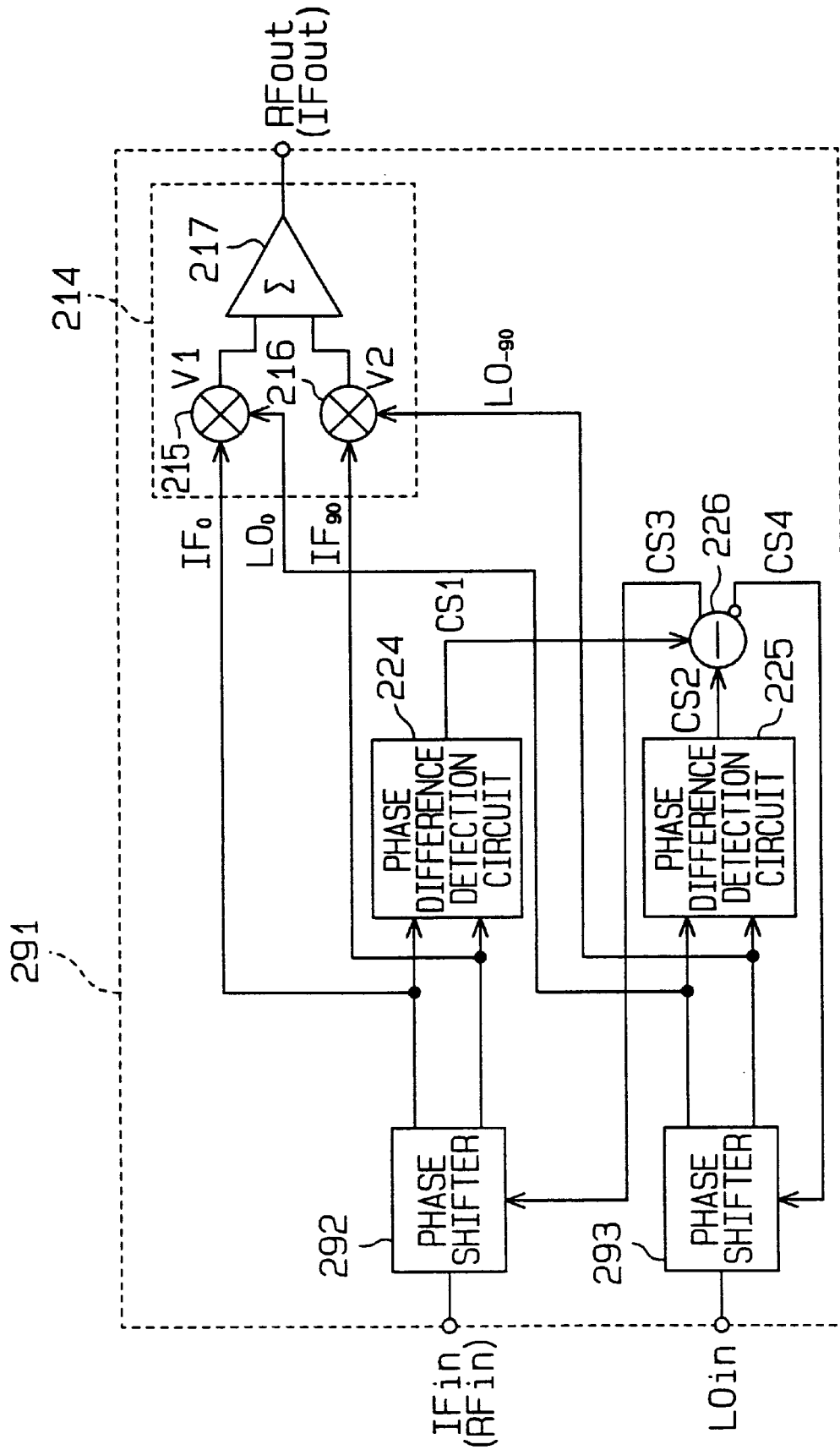
FIG. 28 is a block circuit diagram of an image suppression mixer according to a ninth embodiment of the present invention.

FIG. 28 is a block circuit diagram of an image suppression mixer 291 according to a ninth embodiment of the present invention. The mixer circuit 291 includes first and second phase shifters 292 and 293, the first and second phase difference detection circuits 224 and 225, the differential circuit 226, and the image suppression circuit 214.

The first phase shifter 292 is preferably a phase shifter according to the CR method. The first phase shifter 292 receives the intermediate frequency signal IFin and generates the first intermediate frequency signal IF0 having the same phase as the intermediate frequency signal IFin and the second intermediate frequency signal IF90 having a phase of +90 degrees from the first intermediate frequency signal IF0. The first phase shifter 292 further receives the first control signal CS3 from the differential circuit 226 and shifts the phase of the second intermediate frequency signal IF90 in accordance with the first control signal CS3.

The second phase shifter 293 is also preferably a phase shifter according to the CR method. The second phase shifter 293 receives the local signal LOin and generates the first local signal LO0 having the same phase as the local signal LOin and the second local signal LO-90 having a phase of −90 degrees from the first local signal LO0. The second phase shifter 293 further receives the second control signal CS4 from the differential circuit 226 and shifts the phase of the second local signal LO-90 in accordance with the second control signal CS4.

Figure 29:
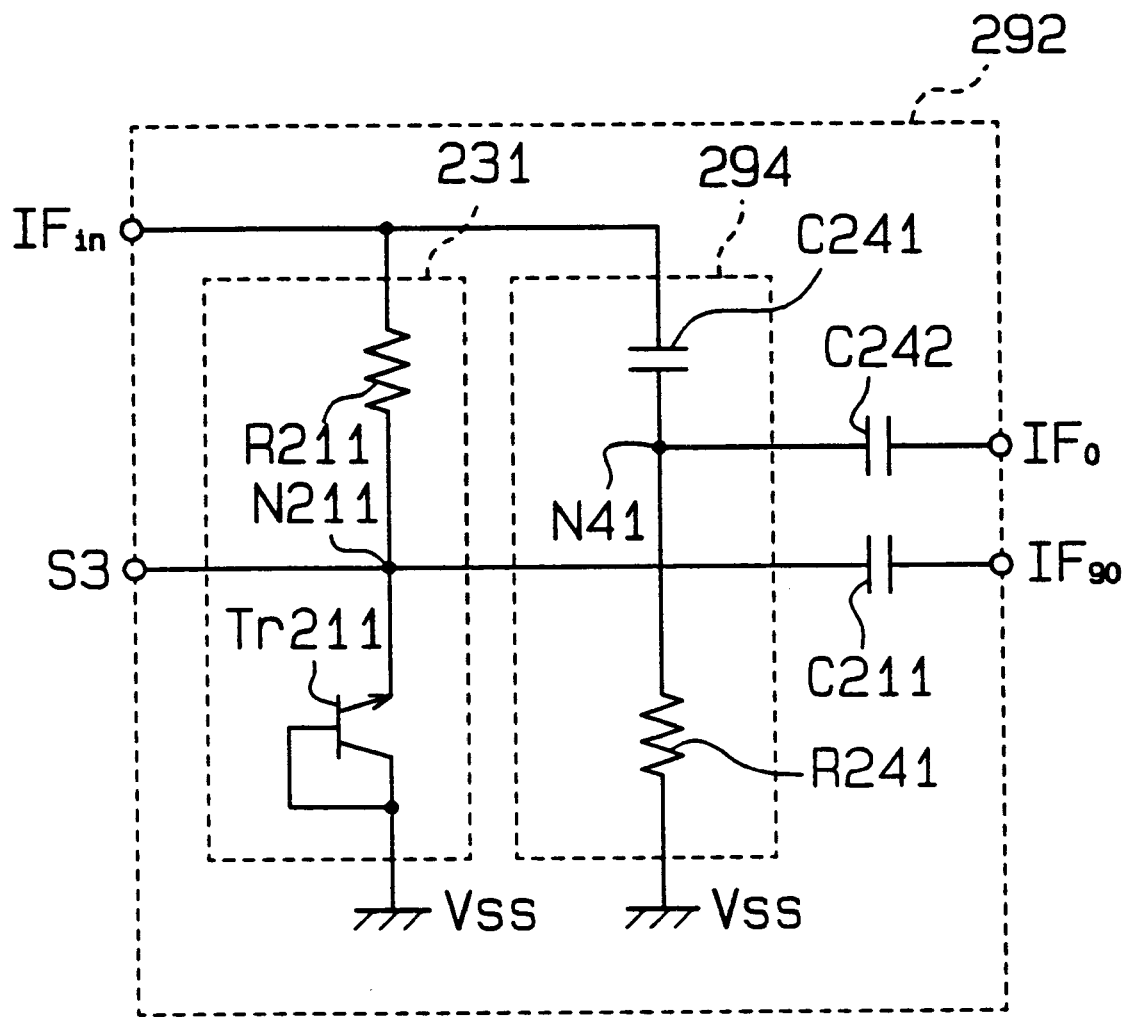
FIG. 29 is a circuit diagram of a phase shifter of the image suppression mixer of FIG. 28.

FIG. 29 is a circuit diagram of the first phase shifter 292. The first phase shifter 292 includes the low pass filter (LPF) 231, a high pass filter (HPF) 294, and the capacitors C211 and C242. The HPF 294 is a differential circuit that includes a capacitor C241 and a resistor R241 connected in series between the low potential power supply Vss and the input terminal of the first phase shifter 292. The HPF 294 outputs the first intermediate frequency signal IF0 from a node N41 (output terminal) between the capacitor C241 and the resistor R241.

Since the phase of the second intermediate frequency signal IF90 and the phase of the second local signal LO-90 are shifted by the first and second phase shifters 292 and 293, the circuit area of the mixer circuit 291 is reduced.

As a modification, the mixer circuit 291 may also comprise the first to fourth amps 262 to 265 as shown in FIG. 25. Further, as shown in FIG. 26 or FIG. 27, an amp may also be provided for either of the intermediate frequency signal and the local signal.

It should be apparent to those skilled in the art that the present invention may be embodied in many specific forms without departing from the sprit or scope of the invention. Therefore, the present examples and embodiments are to be considered as illustrative and not restrictive and the invention is not to be limited to the details given herein, but may be modified within the scope and equivalence of the appended claims.

What is claimed is:

1. An image suppression mixer, comprising:
    a first phase shifter for receiving a first input signal and generating first and second signals having a phase difference of a predetermined degree;
    a second phase shifter for receiving a second input signal and generating third and fourth signals having a phase difference between of a predetermined degree;
    a third phase shifter, connected to the first phase shifter, for receiving the second signal from the first shifter and shifting the phase of the second signal in accordance with a first control signal;
    a fourth phase shifter, connected to the second phase shifter, for receiving the fourth signal from the second phase shifter and shifting the phase of the fourth signal in accordance with a second control signal;
    a first phase difference detection circuit, connected to the first and third phase shifters, for detecting the phase difference between the first and second signals and generating a first detection signal indicating the phase difference;
    a second phase difference detection circuit, connected to the second and third phase shifters, for detecting the phase difference between the third and fourth signals and generating a second detection signal indicating the phase difference;
    a differential circuit, connected to the third and fourth phase shifters and the first and second phase difference detection circuits, for receiving the first and second detection signals and generating the first and second control signals, wherein the first control signal originates from the difference between the first and second detection signals, and the second control signal is an inverse of the first control signal; and
    an image suppression circuit, connected to the first to fourth phase shifters, for receiving the first to fourth signals, generating a first mixing signal by mixing the first and third signals, generating a second mixing signal by mixing the second and fourth signals, and generating a modulation output signal by combining the first and second mixing signals.

2. The image suppression mixer of claim 1, wherein each of the third and fourth phase shifters includes:
    a low pass filter having a resistor connected to an input terminal of the phase shifter and a variable-capacitance element connected in series with the resistor, wherein the associated control signal is applied to a node between the resistor and the variable-capacitance element; and
    a capacitor connected to the node.

3. The image suppression mixer of claim 2, wherein the variable-capacitance elements are bipolar transistors.

4. The image suppression mixer of claim 2, wherein each of the first and second phase detection circuits includes:
    a mixer for receiving the associated two detection signals and generating a mixing signal according to the phase difference therebetween, the mixing signal including a DC component; and
    a low pass filter, connected to the mixer, for generating an associated detection signal having the DC component contained in the mixing signal.

5. The image suppression mixer of claim 4, further comprising:
    first to fourth limiter amps, connected between the first to fourth phase shifters and the image suppression circuit, for receiving the first to fourth signals and generating amplified first to fourth signals having a predetermined amplitude.

6. An image suppression mixer, comprising:
    a first phase shifter for receiving a first input signal and generating first and second signals having a phase difference of a predetermined degree;

a second phase shifter for receiving a second input signal and generating third and fourth signals having a phase difference of a predetermined degree;

a first phase difference detection circuit, connected to the first phase shifter, for detecting the phase difference between the first and second signals and generating a first detection signal indicating the phase difference;

a second phase difference detection circuit, connected to the second phase shifter, for detecting the phase difference between the third and fourth signals and generating a second detection signal indicating the phase difference;

a third phase shifter, connected between the first and second phase difference detection circuits and one of the first and second phase shifters, for receiving one of the second signal and the fourth signal from the connected one of the first phase shifter and the second phase shifter and shifting the phase of the received signal in accordance with a control signal;

a differential circuit, connected to the third phase shifter and the first and second phase difference detection circuits, for receiving the first and second detection signals and generating the control signal originating from the difference between the first and second detection signals; and an image suppression circuit, connected to the first to third phase shifters, for receiving the first to fourth signals, generating a first mixing signal by mixing the first and third signals, generating a second mixing signal by mixing the second and fourth signals, and generating a modulation output signal by combining the first and second mixing signals.

7. The image suppression mixer of claim 6, wherein the third phase shifter includes:

a low pass filter having a resistor connected to an input terminal of the third phase shifter and a variable-capacitance element connected in series with the resistor, wherein the control signal is applied to the node between the resistor and the variable-capacitance element; and a capacitor connected to the node.

8. The image suppression mixer of claim 7, wherein the variable-capacitance element is a bipolar transistor.

9. The image suppression mixer of claim 7, wherein each of the first and second difference detection circuits includes:

a mixer for receiving the associated two signals and generating a mixing signal according to the phase difference of the associated two signals; and a low pass filter, connected to the mixer, for generating the associated detection signal having a DC component contained in the mixing signal.

10. The image suppression mixer of claim 9, further comprising first to fourth limiter amps, connected between the image suppression circuit and the first to third phase shifters, for receiving the first to fourth signals and generating amplified first to fourth signals having a predetermined amplitude.

11. An image suppression mixer, comprising:

a first phase shifter for receiving a first input signal and generating first and second signals having a phase difference of a predetermined degree, wherein the first phase shifter shifts the phase of the second signal in accordance with a first control signal;

a second phase shifter for receiving a second input signal and generating third and fourth signals having a phase difference of a predetermined degree, wherein the second phase shifter shifts the phase of the fourth signal in accordance with a second control signal;

a first phase difference detection circuit, connected to the first phase shifter, for detecting the phase difference between the first and second signals and generating a first detection signal indicating the phase difference;

a second phase difference detection circuit, connected to the second phase shifter, for detecting the phase difference between the third and fourth signals and generating a second detection signal indicating the phase difference;

a differential circuit, connected to the first and second phase shifters and the first and phase difference detection circuits, for receiving the first and second. detection signals and generating the first and second control signals, each of the control signals originating from the difference between the first and second detection signals, wherein the second control signal is an inverse of the first control signal; and an image suppression circuit, connected to the first and second phase shifters, for receiving the first to fourth signals, generating a first mixing signal by mixing the first and third signals, generating a second mixing signal by mixing the second and fourth signals, and generating a modulation output signal by combining the first and second mixing signals.

12. The image suppression mixer of claim 11, wherein the first phase shifter includes, a first high pass filter for receiving the input signal and generating the first signal, and a first low pass filter for receiving the input signal and generating the second signal, and wherein the second phase shifter includes, a second high pass filter for receiving the input signal and generating the third signal; and a second low pass filter for receiving the input signal and receiving the fourth signal.

13. The image suppression mixer of claim 12, wherein the first and second low pass filters each include a resistor connected to an input terminal of the associated phase shifter and a variable-capacitance element connected in series with the resistor, and the associated control signal is applied to a node between the resistor and the variable-capacitance element, and wherein the first and second phase shifters each further include a capacitor connected to the node.

14. The image suppression mixer of claim 13, wherein the variable-capacitance element is a bipolar transistor.

15. The image suppression mixer of claim 13, wherein each of the first and second phase difference detection circuits includes:

a mixer for receiving the associated two signals and generating the mixing signal according to the phase difference of the associated two signals, the mixing signal having a DC component; and a low pass filter, connected to the mixer, for generating the associated detection signal having the DC component contained in the mixing signal.

16. The image suppression mixer of claim 15, further comprising:

first to fourth limiter amps, connected between the image suppression circuit and the first and second phase shifters, for receiving the first to fourth signals and generating amplified first to fourth signals having a predetermined amplitude.

* * * * *